(12) United States Patent
Chiang et al.

(10) Patent No.: US 11,133,044 B2
(45) Date of Patent: Sep. 28, 2021

(54) INTERLEAVED ROUTING FOR MRAM CELL SELECTION

(71) Applicant: Taiwan Semiconductor Manufacturing Co., Ltd., Hsin-Chu (TW)

(72) Inventors: Katherine Chiang, New Taipei (TW); Chung-Te Lin, Tainan (TW); Min Cao, Martinez, CA (US); Randy Osborne, Beaverton, OR (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 267 days.

(21) Appl. No.: 15/995,578

(22) Filed: Jun. 1, 2018

(65) Prior Publication Data

US 2019/0371383 A1   Dec. 5, 2019

(51) Int. Cl.
| | |
|---|---|
| *G11C 11/16* | (2006.01) |
| *H01L 27/22* | (2006.01) |
| *H01L 43/08* | (2006.01) |
| *H01L 43/10* | (2006.01) |
| *H01L 43/12* | (2006.01) |
| *H01L 43/02* | (2006.01) |

(52) U.S. Cl.
CPC ........ *G11C 11/1659* (2013.01); *G11C 11/161* (2013.01); *G11C 11/1655* (2013.01); *G11C 11/1657* (2013.01); *H01L 27/226* (2013.01); *H01L 27/228* (2013.01); *H01L 43/02* (2013.01); *H01L 43/08* (2013.01); *H01L 43/10* (2013.01); *H01L 43/12* (2013.01)

(58) Field of Classification Search
CPC ....... G11C 11/16–1697; G11C 13/0002–0097; H01L 21/2345; H01L 21/823842; H01L 27/11286
See application file for complete search history.

(56) References Cited

U.S. PATENT DOCUMENTS

| | | | |
|---|---|---|---|
| 5,321,657 A | 6/1994 | Arimoto et al. | |
| 5,926,415 A * | 7/1999 | Shin | G11C 17/123 365/185.17 |
| 6,661,040 B2 * | 12/2003 | Takashino | H01L 27/0207 257/202 |
| 6,937,505 B2 * | 8/2005 | Morikawa | G11C 11/16 365/158 |

(Continued)

OTHER PUBLICATIONS

Freescale Semiconductor. "MRAM Technical Guide." Published in 2007.

*Primary Examiner* — Richard Elms
*Assistant Examiner* — R Lance Reidlinger
(74) *Attorney, Agent, or Firm* — Eschweiler & Potashnik, LLC

(57) ABSTRACT

In some embodiments, the present disclosure relates to an integrated circuit. The integrated circuit includes a first memory device and a second memory device arranged over a substrate. The first memory device is coupled to a first bit-line. The second memory device is coupled to a second bit-line. A shared control element is arranged within the substrate and is configured to provide access to the first memory device and to separately provide access to the second memory device. The shared control element includes one or more control devices sharing one or more components.

20 Claims, 13 Drawing Sheets

(56) References Cited

U.S. PATENT DOCUMENTS

| | | | | |
|---|---|---|---|---|
| 7,212,432 B2* | 5/2007 | Ferrant | ............... | G11C 8/14 |
| | | | | 257/E27.005 |
| 7,684,227 B2* | 3/2010 | Liu | ............... | H01L 45/144 |
| | | | | 365/148 |
| 7,961,506 B2* | 6/2011 | Liu | ............... | G11C 13/0004 |
| | | | | 365/148 |
| 8,587,042 B2* | 11/2013 | Kajiyama | ............... | H01L 27/0207 |
| | | | | 257/295 |
| 8,619,459 B1* | 12/2013 | Nguyen | ............... | G11C 13/004 |
| | | | | 365/148 |
| 9,013,911 B2* | 4/2015 | Nazarian | ............... | G11C 11/5678 |
| | | | | 365/129 |
| 9,330,745 B2* | 5/2016 | Seo | ............... | G11C 11/161 |
| 9,646,668 B2* | 5/2017 | Zhou | ............... | G11C 5/063 |
| 2003/0011007 A1 | 1/2003 | Takashino | | |
| 2006/0067112 A1 | 3/2006 | Ferrant et al. | | |
| 2010/0259976 A1 | 10/2010 | Abedifard | | |
| 2013/0322163 A1 | 12/2013 | Ueda | | |
| 2013/0336037 A1 | 12/2013 | Chen et al. | | |
| 2014/0071740 A1 | 3/2014 | Kim et al. | | |
| 2015/0179244 A1 | 6/2015 | Seo et al. | | |
| 2015/0269983 A1 | 9/2015 | Watanabe et al. | | |
| 2017/0040338 A1 | 2/2017 | Lee et al. | | |

\* cited by examiner

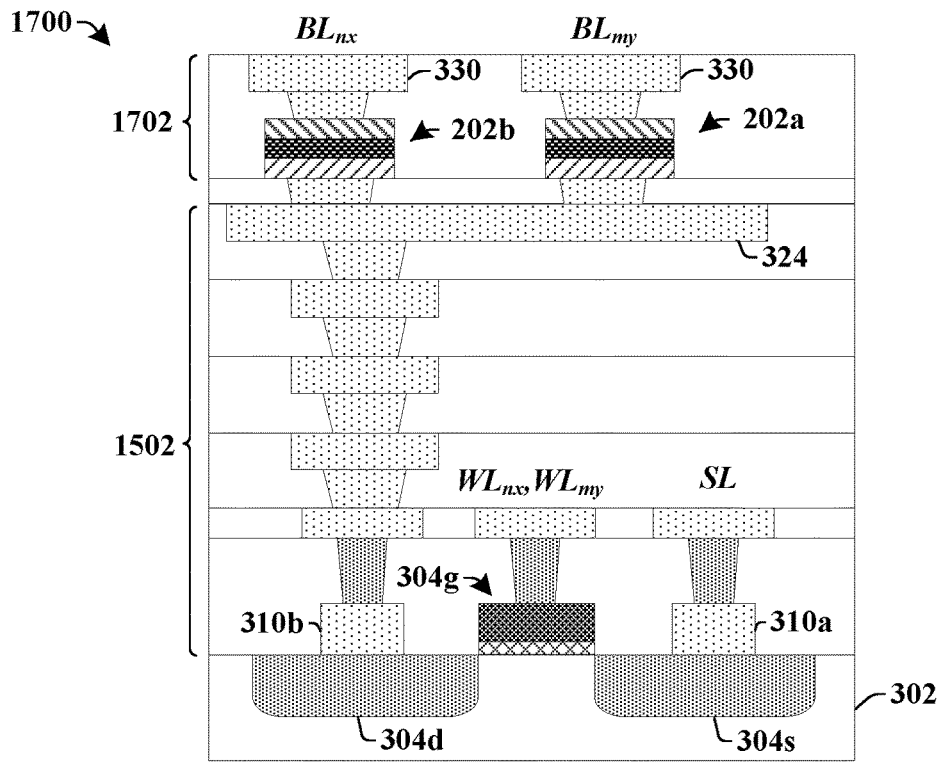

| | |
|---|---|
| Form shared control element having one or more gate structures arranged between a drain region and one or more source regions within a substrate | 1802 |
| Form plurality of interconnect layers within first ILD structure over substrate to couple a source region to a source-line and the one or more gate structures to a first word-line and a second word-line | 1804 |
| Form first MRAM device coupled to the drain region | 1806 |
| Form second MRAM device coupled to the drain region | 1808 |
| Form one or more additional interconnect layers to couple first MRAM device to first bit-line and to couple second MRAM device to second bit-line | 1810 |

INTERLEAVED ROUTING FOR MRAM CELL SELECTION

BACKGROUND

Many modern day electronic devices contain electronic memory configured to store data. Electronic memory may be volatile memory or non-volatile memory. Volatile memory stores data while it is powered, while non-volatile memory is able to store data when power is removed. Magneto-resistive random-access memory (MRAM) is one promising candidate for a next generation non-volatile memory technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13-17 illustrate cross-sectional views of some embodiments of a method of forming an integrated chip having a memory circuit comprising a shared control element configured to separately provide access to multiple MRAM devices.

FIG. 18 illustrates a flow diagram of some embodiments of a method of forming an integrated chip having a memory circuit comprising a shared control element configured to separately provide access to multiple memory devices.

DETAILED DESCRIPTION

Figure 1:
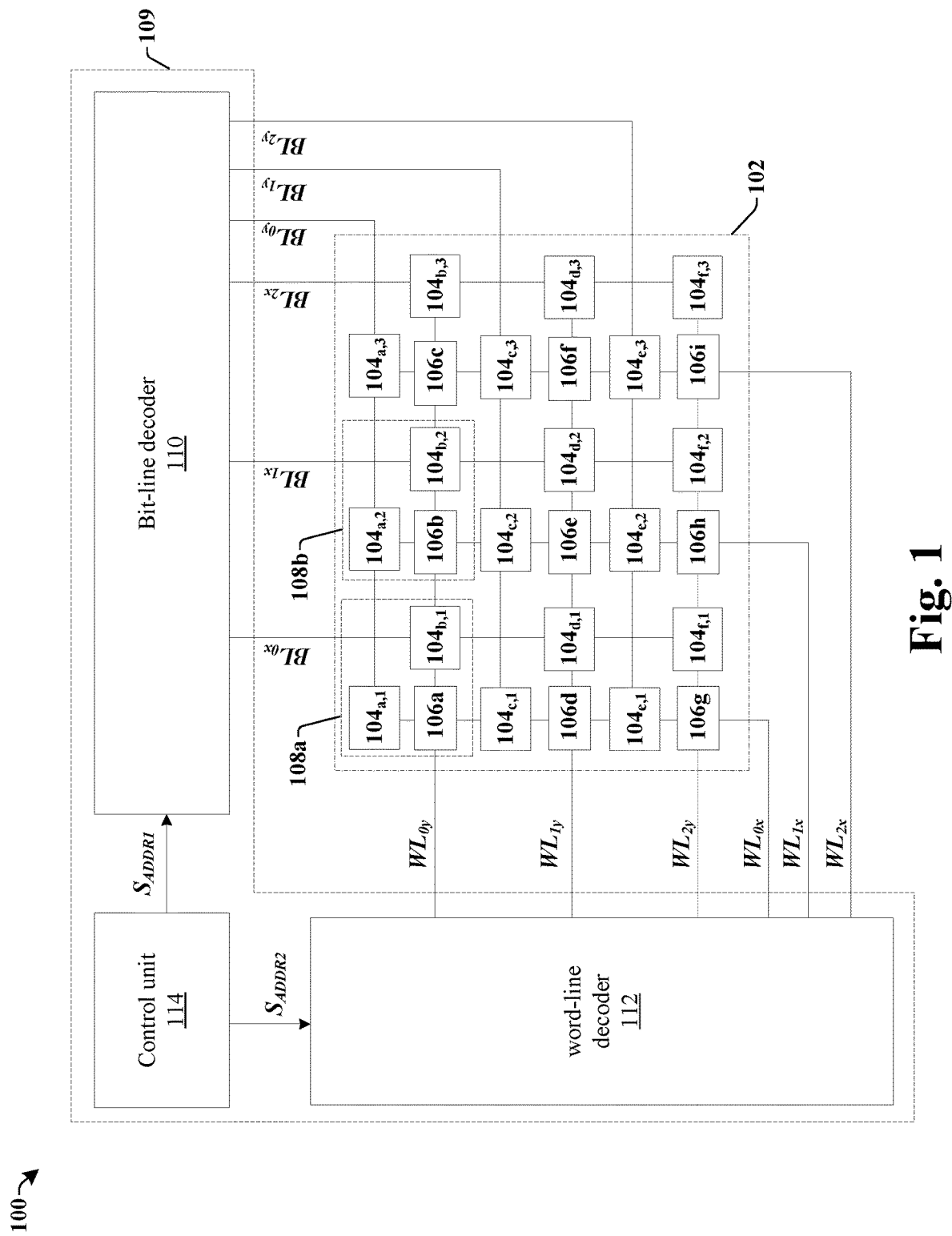
FIG. 1 illustrates a schematic diagram of some embodiments of a memory circuit having a shared control element configured to separately provide access to multiple memory devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-resistive random-access memory (MRAM) devices comprise a magnetic tunnel junction (MTJ) vertically arranged within an integrated chip back-end-of-the-line (BEOL) between conductive electrodes. The MTJ comprises a pinned layer separated from a free layer by a tunnel barrier layer. The magnetic orientation of the pinned layer is static (i.e., fixed), while the magnetic orientation of the free layer is capable of switching between a parallel configuration and an anti-parallel configuration with respect to that of the pinned magnetic layer. The parallel configuration provides for a low resistance state that digitally stores data as a first bit value (e.g., a logical "0"). The anti-parallel configuration provides for a high resistance state that digitally stores data as a second bit value (e.g., a logical "1").

As the functionality of integrated chips increase, the need for more memory also increases, causing integrated chip designers and manufacturers to increase the amount of available memory while decreasing the size and power consumption of an integrated chip. To reach this goal, the size of memory cell components has been aggressively shrunk over the past few decades. One advantage of MRAM devices over other memory types is that the MTJ of an MRAM device can be made to be a very small size. However, in MRAM cells a driving transistor (i.e., an access transistor) is used to provide a voltage to an associated MRAM device during write operations. Because MRAM cells generally use a relatively high voltage and/or current for the write operations, a size of the driving transistor may be relatively large. While an MTJ of an MRAM can be made to have a small size, the relatively large size of the driving transistor limits a density of the MRAM devices within a memory array.

The present disclosure, in some embodiments, relates to an integrated chip comprising a memory array having a shared control element that is configured to separately provide access to multiple different MRAM devices. The shared control element comprises one or more control devices (e.g., driving transistors) that share one or more components (e.g., a source, a drain, etc.). By using a shared control element to provide access to multiple MRAM devices, a size of MRAM cells can be reduced since the cells are not limited by a size of the control devices (e.g., driving transistors).

FIG. 1 illustrates a schematic diagram of some embodiments of a memory circuit 100 having shared control elements configured to separately provide access to multiple memory devices.

The memory circuit 100 comprises a memory array 102 having a plurality of memory devices $104_{a,1}$-$104_{f,3}$ (e.g., MRAM devices). The plurality of memory devices $104_{a,1}$-$104_{f,3}$ are arranged within the memory array 102 in rows and columns. For example, a first row of memory devices comprises memory devices $104_{a,1}$-$104_{a,3}$, while a first column of memory devices comprises memory devices $104_{a,1}$, $104_{c,1}$, and $104_{e,1}$.

The memory array 102 further comprises a plurality of shared control elements 106a-106i configured to provide access to the plurality of memory devices $104_{a,1}$-$104_{f,3}$ (e.g., to enable data to be written to and/or read from a selected one of the plurality of memory devices $104_{a,1}$-$104_{f,3}$). Respective ones of the plurality of shared control elements 106a-106i are configured to separately provide access to two or more of the plurality of memory devices $104_{a,1}$-$104_{f,3}$ within a corresponding memory region 108a-108b. For example, a first shared control element 106a is configured to separately provide access to a first memory device $104_{a,1}$ and a second memory device $104_{b,1}$ within a first memory region 108a, a second shared control element 106b is configured to separately provide access to a third memory device $104_{a,2}$ and a fourth memory device $104_{b,2}$ within a second memory region 108b, etc.

The plurality of shared control elements 106a-106i respectively comprise one or more separate control devices sharing one or more components. In various embodiments, the plurality of shared control elements 106a-106i may comprise one or more transistors sharing a source region, a drain region, and/or a gate structure. For example, in some embodiments, the plurality of shared control elements 106a-106i may respectively comprise a single transistor having a drain region coupled to a first memory device and a second memory device. In other embodiments, the plurality of shared control elements 106a-106i may comprise a first transistor and a second transistor sharing a drain region that is coupled to a first memory device and a second memory device.

The memory array 102 is coupled to control circuitry 109 by way of a plurality of bit-lines $BL_{0x}$-$BL_{2x}$ and $BL_{0y}$-$BL_{2y}$ and a plurality of word-lines $WL_{0x}$-$WL_{2x}$ and $WL_{0y}$-$WL_{2y}$. In some embodiments, the control circuitry 109 comprises a bit-line decoder 110 and a word-line decoder 112 coupled to a control unit 114. The plurality of bit-lines $BL_{0x}$-$BL_{2x}$ and $BL_{0y}$-$BL_{2y}$ couple respective ones of the plurality of memory devices $104_{a,1}$-$104_{f,3}$ to the bit-line decoder 110, while the plurality of shared control elements 106a-106i are coupled to the word-line decoder 112 by way of two or more of the plurality of word-lines $WL_{0x}$-$WL_{2x}$ and $WL_{0y}$-$WL_{2y}$.

In some embodiments, the plurality of shared control elements 106a-106i are respectively coupled to two or more of the plurality of word-lines $WL_{0x}$-$WL_{2x}$ and $WL_{0y}$-$WL_{2y}$ extending in different directions, while memory devices within respective ones of the plurality of memory regions 108a-108b are coupled to bit-lines extending in different directions. For example, a shared control element 106a within a first memory region 108a is coupled a first word-line $WL_{0y}$ extending along a row of shared control elements 106a-106c and a second word-line $WL_{0x}$ extending along a column of shared control elements 106a, 106d, and 106g. Similarly, a first memory device $104_{a,1}$ within the first memory region 108a is coupled to a bit-line $BL_{0y}$ extending along a row of the memory devices and a second memory device $104_{b,1}$ within the first memory region 108a is coupled to a bit-line $BL_{0x}$ extending along a column of memory devices.

To access a memory device (e.g., to read data from the memory device or write data to the memory device), the bit-line decoder 110 is configured to selectively provide signals to one or more of the plurality of bit-lines $BL_{0x}$-$BL_{2x}$ and $BL_{0y}$-$BL_{2y}$ based upon an address $S_{ADDR1}$ received from the control unit 114, while the word-line decoder 112 is configured to selectively provide signals to one or more of the plurality of word-lines $WL_{0x}$-$WL_{2x}$ and $WL_{0y}$-$WL_{2y}$ based upon an address $S_{ADDR2}$ received from the control unit 114. In some embodiments, an asserted bit-line and word-line combination may comprise a bit-line extending in a first direction (e.g., horizontally or vertically) and a word-line extending in a second direction (e.g., vertically or horizontally). For example, a memory device may be selected by activating a vertically extending bit-line $BL_{nx}$ (n=1, 2, ... ) and a horizontally extending word-line $WL_{my}$ (m=1, 2, ... ) or by activating a horizontally extending bit-line $BL_{ny}$ and a vertically extending word-line $WL_{mx}$ (e.g., to activate memory device $104_{a,1}$ bit-lines $BL_{0y}$ and word-line $WL_{0x}$ are activated). By activating a combination of bit-lines and word-lines extending in different directions, the shared control elements 106a-106i can access different ones of the plurality of memory devices $104_{a,1}$-$104_{f,3}$ in a mutually exclusive way (i.e., independently).

Using the shared control elements 106a-106i to respectively provide access to more than one of the plurality of memory devices $104_{a,1}$-$104_{f,3}$ allows a size occupied by control devices within the memory array 102 to be reduced. By reducing a size occupied by control devices within the memory array 102, a size of the memory array 102 can be reduced. Moreover, in some embodiments a size of the control devices can be increased without increasing a size of the memory array 102. By increasing a size of the control devices, a current delivered by the control devices can be increased and performance of the memory array 102 can be improved (e.g., increasing a 'read window' (a difference in signals read out from a memory device between a "1" and a "0) of the plurality of memory devices $104_{a,1}$-$104_{f,3}$) without increasing a size of the memory array 102.

Figure 2:
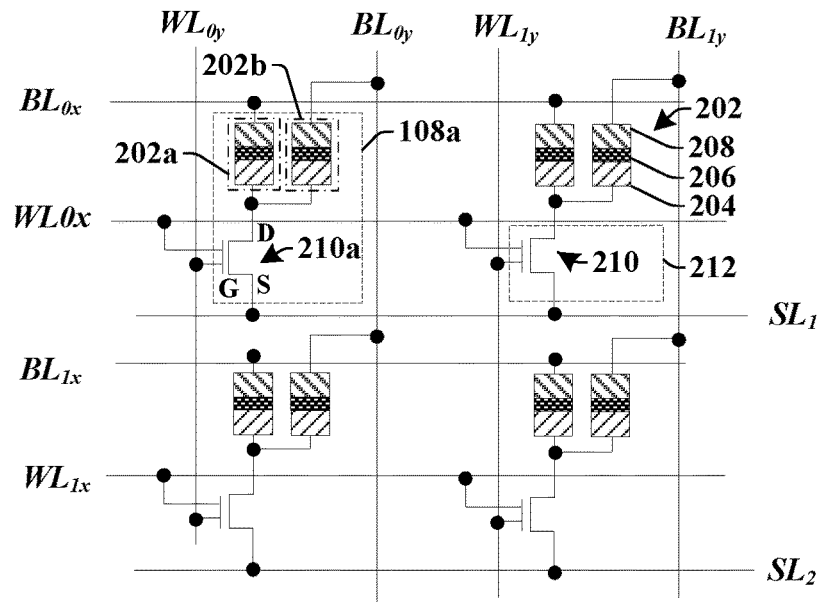
FIG. 2 illustrates a schematic diagram of some additional embodiments of a memory circuit having a shared control element comprising a driving transistor configured to separately provide access to multiple magneto-resistive random-access memory (MRAM) devices.

FIG. 2 illustrates some additional embodiments of a memory array 200 having a shared control element comprising a shared driving transistor configured to separately provide access to multiple MRAM devices.

The memory array 200 comprises a plurality of MRAM devices 202 arranged in rows and columns. The plurality of MRAM devices 202 respectively comprise a magnetic tunnel junction (MTJ) having a pinned layer 204 and a free layer 208 separated by a tunnel dielectric layer 206. The magnetic orientation of the pinned layer 204 is static (i.e., fixed), while the magnetic orientation of the free layer 208 is capable of switching between a parallel configuration and an anti-parallel configuration with respect to that of the pinned layer 204. The parallel configuration provides for a low resistance state that digitally stores data as a first bit value (e.g., a logical "0"). The anti-parallel configuration provides for a high resistance state that digitally stores data as a second bit value (e.g., a logical "1"). During operation, the MTJ can be changed between the low resistance state and the high resistance state through the tunnel magnetoresistance (TMR) effect.

Two or more of the plurality MRAM devices 202 are coupled between a shared control element 212 comprising a shared driving transistor 210 (i.e., a shared access transistor) and separate bit-lines extending in different directions. For example, within memory region 108a a first MRAM device 202a is coupled between a shared driving transistor 210a and a first bit-line $BL_{0x}$ extending along a row of the plurality of MRAM devices 202, while a second MRAM device 202b is coupled between the shared driving transistor 210a and a second bit-line $BL_{0y}$ extending along a column of the plurality of MRAM devices 202.

The shared driving transistor 210 comprises a source terminal (S), a drain terminal (D), and a gate terminal (G). The source terminal is coupled to a source-line, $SL_1$ or $SL_2$, the drain terminal is coupled to two or more of the plurality of MRAM devices 202, and the gate terminal is coupled to two or more word-lines $WL_{my}$ and $WL_{nx}$ (m,n=0 or 1) extending in different directions. For example, a first driving transistor 210a has a source terminal coupled to a first source-line $SL_1$, a drain terminal coupled to a first MRAM device 202a and a second MRAM device 202b, and a gate terminal coupled to a first word-line $WL_{0x}$ extending along a row of shared driving transistors and a second word-line $WL_{0y}$ extending along a column of shared driving transistors.

Because the shared driving transistor 210 is shared between multiple MRAM devices 202, a size of the memory array 200 can be reduced. Furthermore, a size of the shared driving transistor 210 (e.g., a gate width) can be increased, thereby increasing a current capability of the shared driving transistor 210. The larger current capacity of the shared driving transistor 210 allows for higher tunnel magneto resistance (TMR), leading to larger read margins and faster read operations.

Figure 3A:
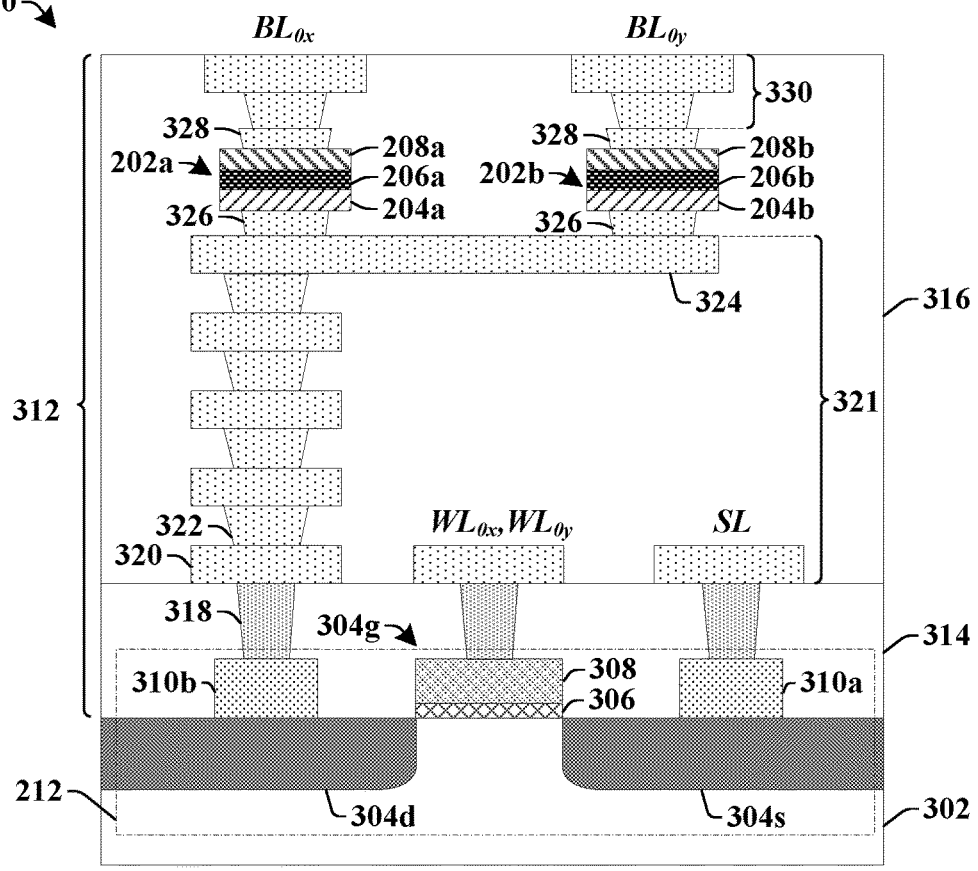
FIGS. 3A-3C illustrate some embodiments of an integrated chip having a shared control element configured to separately provide access to multiple MRAM devices.

FIG. 3A illustrates a cross-sectional view of some embodiments of an integrated chip 300 having multiple memory devices coupled to a shared control element.

The integrated chip 300 comprises a shared control element 212 arranged within a substrate 302. In some embodiments, the shared control element 212 may comprise a single control device comprising a MOSFET having a gate structure 304g arranged over the substrate 302 between a source region 304s and a drain region 304d. The gate structure 304g comprises a gate electrode 308 separated from the substrate 302 by a gate dielectric 306. In some embodiments, sidewall spacers (not shown) comprising a dielectric material (e.g., an oxide, a nitride, a carbide, or the like) may be arranged on opposing sides of the gate structure 304g. In other embodiments, the shared control element 212 may comprise, a bi-polar junction transistor (BJT), a high electron mobility transistor (HEMT), or a similar device. In some embodiments, the shared control element 212 may comprise a FinFET device having a gate structure 304g that extends over multiple semiconductor fins extending between source and drain regions. By having the gate structure 304g extend over multiple semiconductor fins, a driving current of the FinFET device can be increased over a FinFET device having a single fin.

In some embodiments, the gate electrode 308 may comprise polysilicon. In such embodiments, the gate dielectric 306 may include a dielectric material, such as an oxide (e.g., silicon dioxide), a nitride (e.g., silicon-nitride), or the like. In other embodiments, the gate electrode 308 may comprise a metal, such as aluminum, copper, titanium, tantalum, tungsten, molybdenum, cobalt, or the like. In such embodiments, the gate dielectric 306 may comprise a high-k dielectric material, such as hafnium oxide, hafnium silicon oxide, hafnium tantalum oxide, aluminum oxide, zirconium oxide, or the like.

A dielectric structure 312 is arranged over the substrate 302. In some embodiments, the dielectric structure 312 may comprise a pre-metal dielectric layer 314 surrounding middle-end-of-line (MEOL) structures 310a-310b arranged onto the source region 304s and the drain region 304d, and further surrounding conductive contacts 318 arranged on the MEOL structures 310a-310b and the gate electrode 308. The dielectric structure 312 also comprises a plurality of stacked ILD layers 316 arranged over the pre-metal dielectric layer 314. The plurality of stacked ILD layers 316 surround a plurality of interconnect layers 321 comprising alternating layers of interconnect wires 320 and vias 322. The plurality of interconnect layers 321 couple the source region 304s to a source-line, SL, the gate structure 304g to two or more word-lines $WL_{0x}$ and $WL_{0y}$, and drain region 304d to a first MRAM device 202a and to a second MRAM device 202b within the dielectric structure 312. In some embodiments, an interconnect wire 324 continuously extends from directly below the first MRAM device 202a to directly below the second MRAM device 202b. In some embodiments, the first MRAM device 202a and the second MRAM device 202b are arranged directly above the shared control element 212, thereby providing for a small footprint. In some embodiments, the interconnect wires 320 and vias 322 may comprise one or more of copper, aluminum, tungsten, carbon nanotubes, or the like.

The first MRAM device 202a comprises a first magnetic tunnel junction (MTJ) vertically arranged between a bottom electrode via 326 and a top electrode via 328. The first MTJ comprises a first pinned layer 204a vertically separated from a first free layer 208a by a first dielectric tunnel barrier 206a. The first pinned layer 204a has a magnetization that is fixed, while the first free layer 208a has a magnetization that can be changed to be either parallel (i.e., a 'P' state) or anti-parallel (i.e., an 'AP' state) with respect to the magnetization of first pinned layer 204a. In some embodiments, the first MRAM device 202a may comprise additional layers (e.g., an anti-ferromagnetic layer between the bottom electrode via 326 and the first pinned layer 204a). The first pinned layer 204a is coupled to the shared control element 212 by way of a first conductive path comprising the plurality of interconnect layers 321, while the first free layer is 208a coupled to a first bit-line $BL_{0x}$ by way of one or more additional interconnect layers 330 over the first MRAM device 202a. In some embodiments, the position of the first pinned layer 204a and the first free layer 208a may be opposite (e.g., the first free layer 208a may be between the first pinned layer 204a and the bottom electrode via 326).

The second MRAM device 202b comprises a second magnetic tunnel junction (MTJ) vertically arranged between a bottom electrode via 326 and a top electrode via 328. The second MTJ comprises a second pinned layer 204b vertically separated from a second free layer 208b by a second dielectric tunnel barrier 206b. The second pinned layer 204b is coupled to the shared control element 212 by way of a second conductive path comprising the plurality of interconnect layers 321, while the second free layer 208b is coupled to a second bit-line $BL_{0y}$ by way of one or more additional interconnect layers 330 over the second MRAM device 202b. In some embodiments, the position of the second pinned layer 204b and the second free layer 208b may be opposite.

In some embodiments, the bottom electrode via 326 and the top electrode via 328 may comprise a metal such as titanium nitride (TiN), tantalum nitride (TaN), titanium (Ti), tantalum (Ta), or the like. In some embodiments, the first pinned layer 204a and the second pinned layer 204b may comprise cobalt (Co), iron (Fe), boron (B), ruthenium (Ru), or the like. In some embodiments, the first dielectric tunnel barrier 206a and the second dielectric tunnel barrier 206b may comprise magnesium oxide (MgO), aluminum oxide ($Al_2O_3$), or the like. In some embodiments, the first free layer 208a and the second free layer 208b may comprise cobalt (Co), iron (Fe), boron (B), or the like.

Figure 3B:
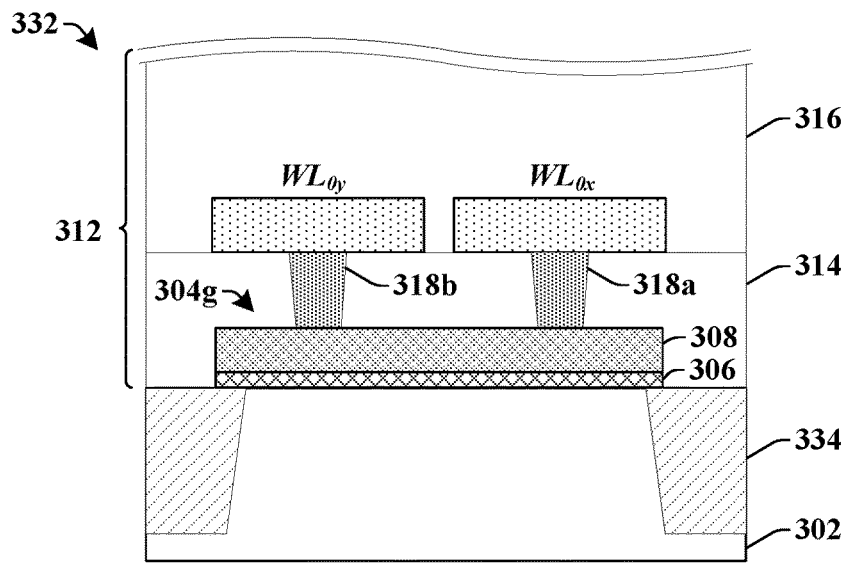

FIG. 3B illustrates a cross-sectional view 332 of some embodiments of the integrated chip 300 of FIG. 3A.

As shown in cross-sectional view 332, the first word-line $WL_{0x}$ is coupled to the gate electrode 308 by a first conductive contact 318a disposed on an upper surface of the gate electrode 308 and the second word-line $WL_{0y}$ is coupled to the gate electrode 308 by a second conductive contact 318b disposed on the upper surface of the gate electrode 308. The first conductive contact 318a and the second conductive contact 318b are separated from one another by the pre-metal dielectric layer 314. In some embodiments, the gate structure 304g may extend to over isolation regions 334 (e.g., shallow trench isolation regions) within the substrate 302.

Figure 3C:
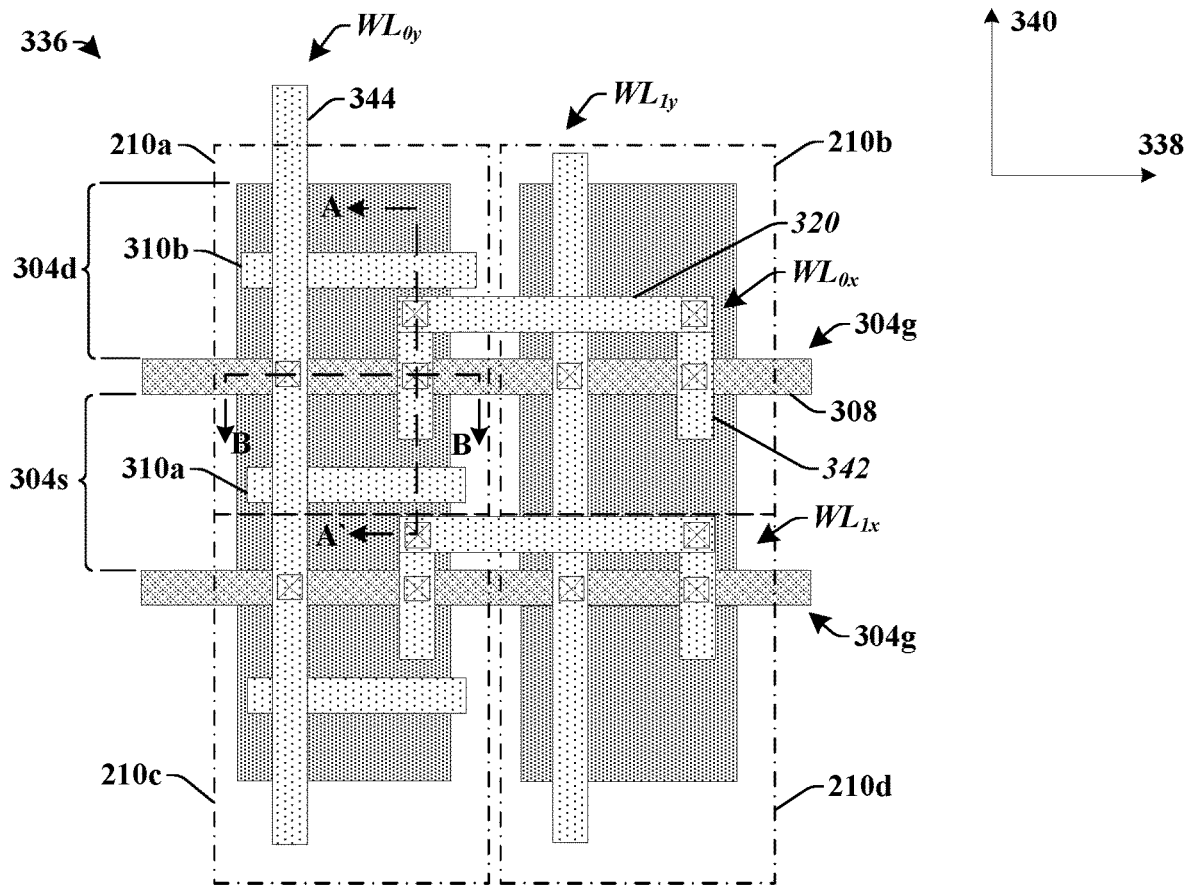

FIG. 3C illustrates a top-view 336 of some embodiments of the integrated chip 300 of FIG. 3A. The cross-sectional view of FIG. 3A is illustrated along line A-A' and cross-sectional view 332 of FIG. 3B is illustrated along line B-B' shown in top-view 336.

As shown in the top-view 336, the gate structure 304g is arranged within a memory array having a plurality of driving transistors 210a-210d. The gate structure 304g extends along a first direction 338 between source regions 304s and drain regions 304d. In some embodiments, the first word-line $WL_{0x}$ comprises a plurality of discrete interconnect wires 342 respectively extending over the gate structure 304g along a second direction 340 and separated along the first direction 338 by a non-zero distance. The plurality of discrete interconnect wires 342 are coupled together by an interconnect wire 320 over the discrete interconnect wires 342, so that the first word-line $WL_{0x}$ is connected to driving transistors, 210a and 210b, arranged in the first direction (e.g., along a row of a memory array). The second word-line $WL_{0y}$ comprises an unbroken interconnect wire 344 that continuously extends over a plurality of gate structures 304g along the second direction 340, so that the second word-line $WL_{0y}$ is connected to driving transistors, 210a and 210c, arranged in the second direction (e.g., along a column of a memory array).

Figure 4:
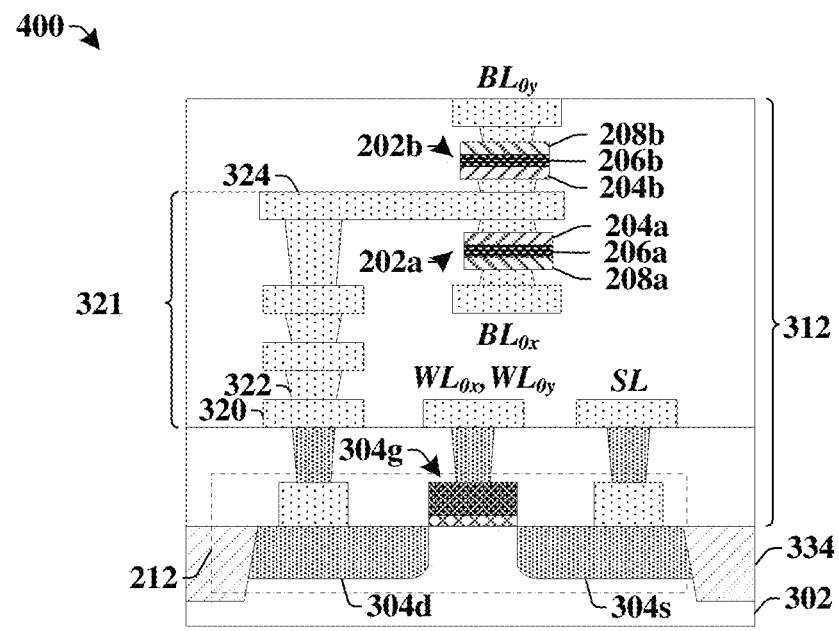
FIGS. 4-5 illustrate cross-sectional views of some alternative embodiments of an integrated chip having a shared control element configured to separately provide access to multiple MRAM devices.

FIG. 4 illustrates a cross-sectional view of some alternative embodiments of an integrated chip 400 having multiple MRAM devices coupled to a shared control element.

The integrated chip 400 includes a shared control element 212 comprising a MOSFET arranged within a substrate 302 and having a source region 304s, a gate structure 304g, and a drain region 304d. A dielectric structure 312 over the substrate 302 surrounds a plurality of interconnect layers 321, comprising interconnect wires 320 and vias 322. The plurality of interconnect layers 321 couple the source region 304s to a source-line SL, the gate structure 304g to two or more word-lines $WL_{0x}$ and $WL_{0y}$, and the drain region 304d to a first MRAM device 202a and a second MRAM device 202b.

The first MRAM device 202a and the second MRAM device 202b are arranged at different heights with respect to the substrate 302. For example, the first MRAM device 202a has a bottommost surface that is closer to the substrate 302 than a bottommost surface of the second MRAM device 202b. In some embodiments, the first MRAM device 202a and the second MRAM device 202b may be arranged directly above the shared control element 212. In some embodiments, the second MRAM device 202b may be arranged directly above the first MRAM device 202a. In other embodiments, the second MRAM device 202b and the first MRAM device 202a may be laterally offset from one another. Having the first MRAM device 202a and the second MRAM device 202b at different vertical positions allows for a memory array to achieve a small footprint.

In some embodiments, the plurality of interconnect layers 321 comprise an interconnect wire 324 that is vertically arranged vertically between the first MRAM device 202a and the second MRAM device 202b. In some such embodiments, the first MRAM device 202a comprises a first pinned layer 204a arranged along a lower surface of the interconnect wire 324. A first dielectric tunnel barrier 206a separates the first pinned layer 204a from a first free layer 208a coupled to a first bit-line $BL_{0x}$. The second MRAM device 202b comprises a second pinned layer 204b arranged along an upper surface of the interconnect wire 324. A second dielectric tunnel barrier 206b separates the second pinned layer 204b from a second free layer 208b coupled to a second bit-line BL In some embodiments, the positions of the pinned layers and the free layers may be opposite.

Figure 5:
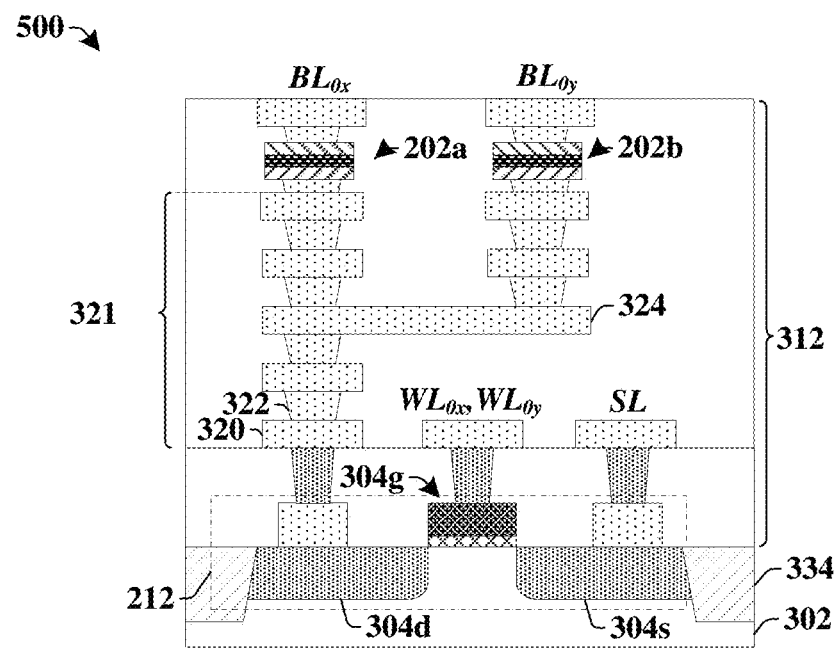

FIG. 5 illustrates a cross-sectional view of some additional alternative embodiments of an integrated chip 500 having multiple MRAM devices coupled to a shared control element.

The integrated chip 500 includes a shared control element 212 comprising a MOSFET arranged within a substrate 302 and having a source region 304s, a gate structure 304g, and a drain region 304d. A dielectric structure 312 over the substrate 302 surrounds a plurality of interconnect layers 321, comprising interconnect wires 320 and vias 322. The plurality of interconnect layers 321 couple the source region 304s to a source-line SL, the gate structure 304g to two or more word-lines $WL_{0x}$ and $WL_{0y}$, and the drain region 304d to a first MRAM device 202a and a second MRAM device 202b.

The plurality of interconnect layers 321 comprise an interconnect wire 324 that is vertically separated from the first MRAM device 202a and the second MRAM device 202b by at least one interconnect wire. For example, integrated chip 500 comprises a first conductive path having one or more interconnect wires and vias extending from the interconnect wire 324 to the first MRAM device 202a. A second conductive path comprising one or more interconnect wires and vias also extends from the interconnect wire 324 to the second MRAM device 202b.

Although FIGS. 1-5 describe a memory array comprising shared control elements coupled to two memory devices, it will be appreciated that the disclosed memory circuit is not limited to such embodiments. Rather, in some additional embodiments the disclosed memory circuit may have shared control elements coupled to larger number of memory devices. For example, in various embodiments, a memory array may comprise three, four, or more memory devices coupled to a shared control element. In some embodiments, a size of a memory array can be optimized by selecting a number of memory devices that are coupled to a shared control element based upon a MTJ pitch, a fin pitch, and/or a metal gate pitch.

Figure 6:
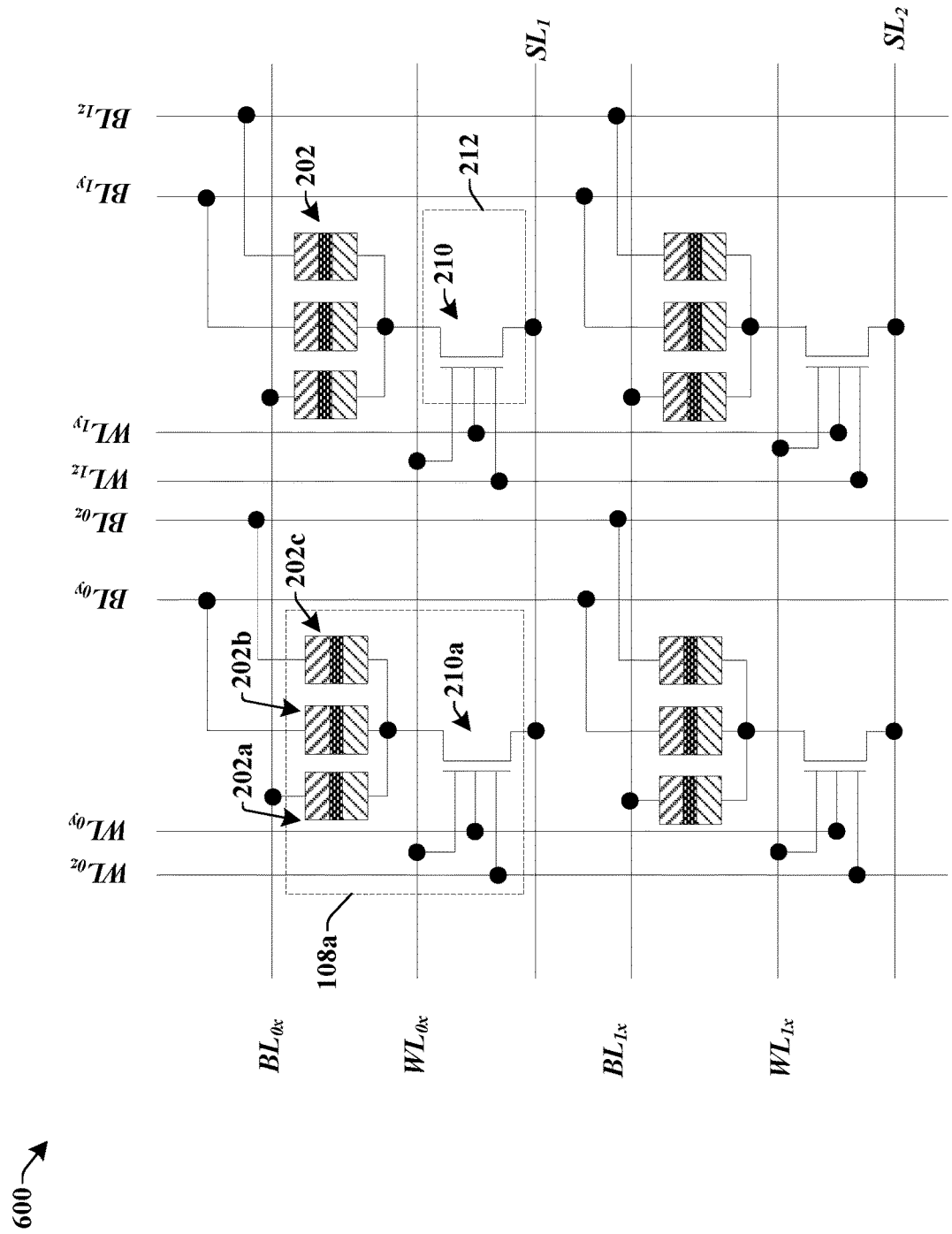
FIG. 6 illustrates a schematic diagram of some additional embodiments of a memory circuit having a shared control element configured to separately provide access to three MRAM devices.

FIG. 6 illustrates some additional embodiments of a memory array 600 having shared control elements respectively configured to separately provide access to three MRAM devices.

The memory array 600 comprises a plurality of MRAM devices 202 arranged in rows and columns. Three of the plurality of MRAM devices 202 are coupled to a shared control element 212 comprising a shared driving transistor 210 configured to provide access to the MRAM devices 202. The shared driving transistor 210 has a source terminal coupled to a source-line, a gate terminal coupled to three word-lines, and a drain terminal coupled to three MRAM devices respectively coupled to separate bit-lines. For example, a first memory region 108a comprises a first driving transistor 210a having a source terminal coupled to a first source-line $SL_1$, a gate terminal coupled to a first word-line $WL_{0x}$, a second word-line $WL_{0y}$, and a third word-line $WL_{0z}$, and a drain terminal coupled to a first MRAM device 202a, a second MRAM device 202b, and a third MRAM device 202c.

To access one of the plurality of MRAM devices 202 within the memory array 600, a bit-line and word-line combination is asserted. The bit-line and word-line combination comprises a bit-line extending in a first direction (e.g., horizontally or vertically) and a word-line extending in a second direction (e.g., vertically or horizontally). For example, an MRAM device may be accessed by activating a bit-line $BL_{nx}$ (n=1,2,3 ... ) and a word-line $WL_{my}$ (m=1,2,3 ... ), a bit-line $BL_{ny}$ (n=1,2,3 ... ) and a word-line $WL_{mx}$ (m=1,2,3 ... ), a bit-line $BL_{nz}$ (n=1,2,3 ... ) and a word-line $WL_{mz}$ (m=1,2,3 ... ), etc.

Figure 7:
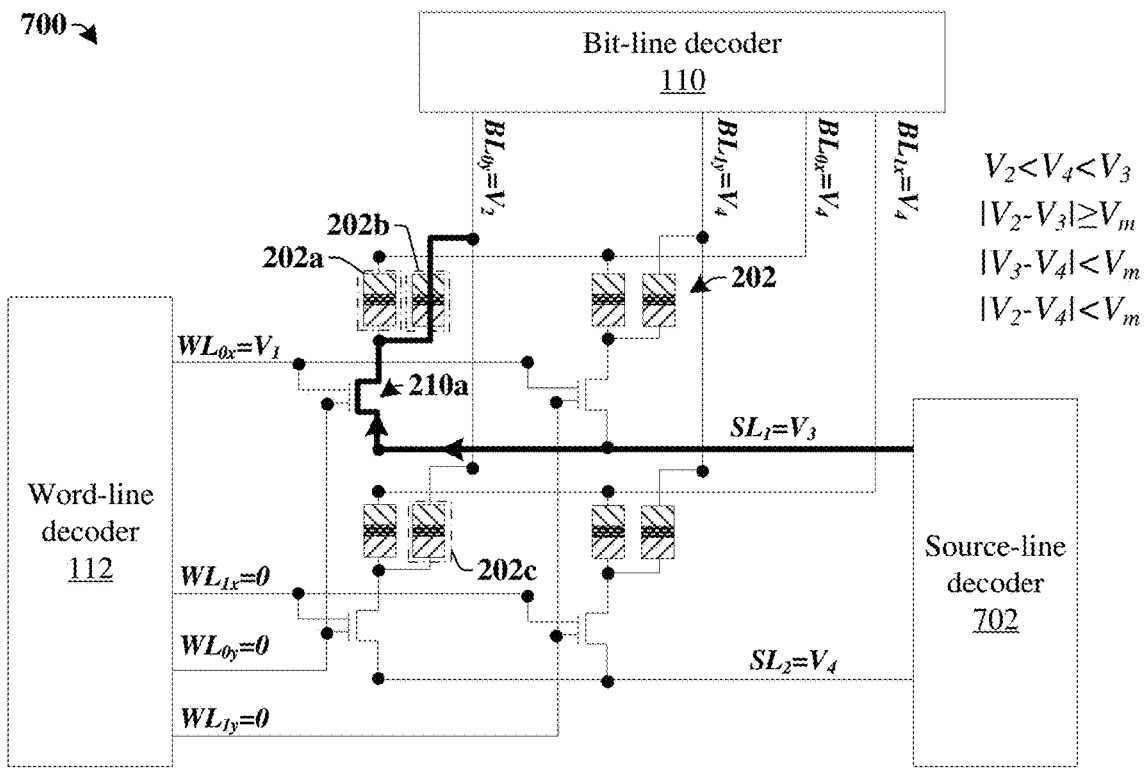
FIGS. 7-8 illustrate some embodiments of schematic diagrams showing operation of a memory circuit having a shared control element configured to separately provide access to multiple MRAM devices.

FIG. 7 illustrates some embodiments of a schematic diagram 700 showing a write operation that writes a data state to an MRAM device. It will be appreciated that the write operation shown in schematic diagram 700 is one non-limiting example of a method of performing a write operation, and that other methods of performing a write operation may alternatively be used.

As shown in schematic diagram 700, the write operation is performed on a second MRAM device 202b, which is operably coupled to a bit-line decoder 110 by a bit line $BL_{0y}$, a word-line decoder 112 by a word-line $WL_{0x}$, and a source-line decoder 702 by a source-line $SL_1$. To write data to an MRAM device, the current provided through the MRAM device must be larger than a switching current (i.e., a critical switching current). Currents that are not larger than the switching current will not cause a switching between states and therefore not write data to the MRAM device.

The write operation is performed by operating the word-line decoder 112 to apply a first non-zero bias voltage $V_1$ to word-line $WL_{0x}$, the bit-line decoder 110 to apply a second non-zero bias voltage $V_2$ to bit-line $BL_{0y}$, and the source-line decoder 702 to apply a third non-zero bias voltage $V_3$ to a source-line $SL_1$. The first non-zero bias voltage $V_1$ turns on a shared driving transistor 210a to form a conductive path between the source-line $SL_1$ and the second MRAM device 202b. The second non-zero voltage $V_2$ and the third non-zero voltage $V_3$ form a first potential difference that causes a current, which is larger than the switching current, to flow through the second MRAM device 202b.

If the second non-zero bias voltage $V_2$ is lower than the third non-zero bias voltage $V_3$, a current will travel from the source-line $SL_1$ to the bit-line $BL_{0y}$. The current will be polarized by a pinned layer of the second MRAM device 202b and will cause a free layer of the second MRAM device 202b to have a parallel magnetization that causes the second MRAM device 202b to have a low resistance state that digitally stores data as a first bit value (e.g., a logical "0"). Alternatively, if the second non-zero bias voltage $V_2$ is higher than the third non-zero bias voltage $V_3$, a current will travel from the bit-line $BL_{0y}$ to the source-line $SL_1$. The current causes electrons polarized in the direction of the free layer to pass through the tunnel dielectric layer to the pinned layer. On reaching the pinned layer, the electrons with spin polarization in the direction of the pinned layer are allowed to pass while electrons without spin polarization are reflected back causing the free layer to have an anti-parallel magnetization that causes the second MRAM device 202b to have a high resistance state that digitally stores data as a second bit value (e.g., a logical "1").

To prevent unwanted writing of data to non-accessed MRAM devices, the other bit-lines and/or word-lines may also be biased. For example, turning on the shared driving transistor 210a also forms a conductive path between the source-line $SL_1$ and a first MRAM device 202a adjacent to the second MRAM device 202b. To prevent unwanted leakage currents from flowing through the first MRAM device 202a, bit-line $BL_{0x}$ is set to a fourth non-zero bias voltage $V_4$ that is between the second non-zero bias voltage $V_2$ and the third non-zero bias voltage $V_3$ (i.e., $V_2 < V_4 < V_3$). By selecting a difference between the fourth non-zero bias voltage $V_4$ and the third non-zero bias voltage $V_3$ to be sufficiently small, a current provided to the first MRAM device 202a will be smaller than a switching current and data is not written to the first MRAM device 202a. Similarly, other select-lines and bit-lines may be biased as shown in FIG. 7 to avoid unwanted writing of data to non-accessed MRAM devices (e.g., a difference between the fourth non-zero bias voltage $V_4$ and the second non-zero bias voltage $V_2$ may be selected to be sufficiently small so as to provide a current to MRAM device 202c that is smaller than the switching current).

Figure 8:
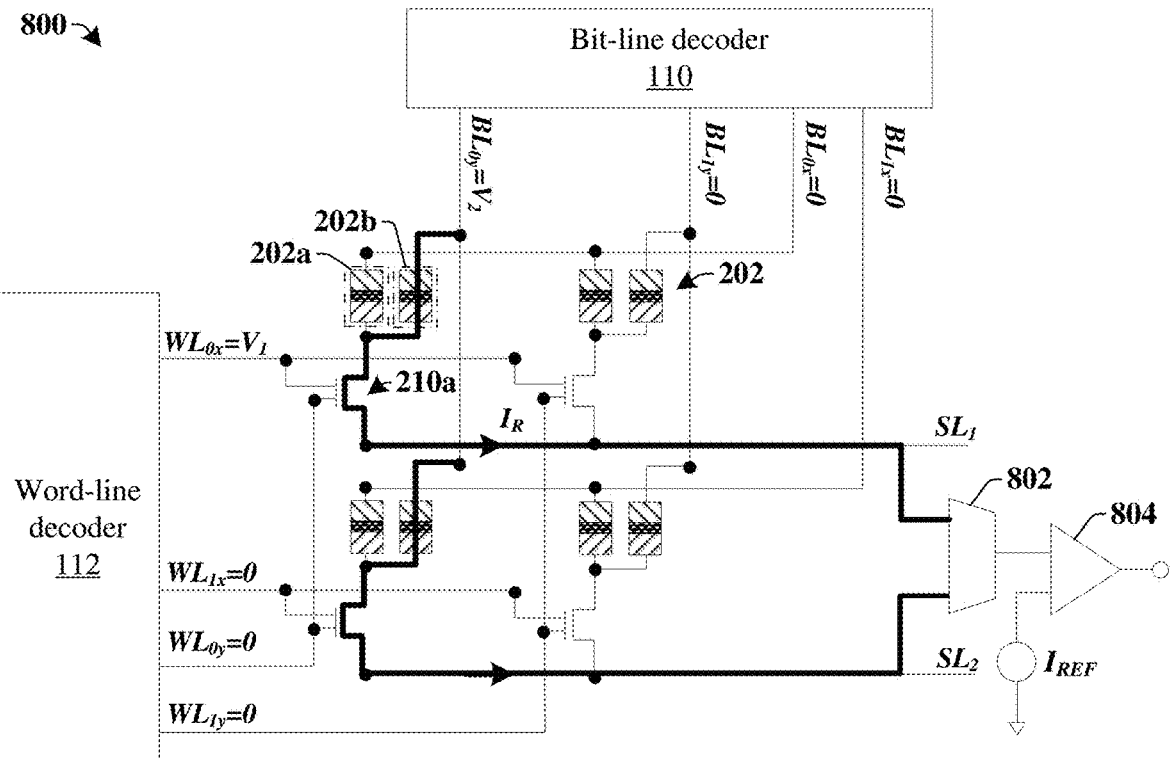

FIG. 8 illustrates some embodiments of a schematic diagram 800 showing a read operation that reads a data state from an MRAM device.

As shown in schematic diagram 800, a read operation is performed on a second MRAM device 202b by applying a first non-zero bias voltage $V_1$ to word-line $WL_{0x}$ and a second non-zero bias voltage $V_2$ to bit-line $BL_{0y}$. The first non-zero bias voltage $V_1$ turns on driving transistor 210a and the second non-zero bias voltage $V_2$ will cause a current $I_R$ to pass through the second MRAM device 202b. The current $I_R$ passing through the second MRAM device 202b has a value that is dependent upon a resistive state of the second MRAM device 202b. For example, if the second MRAM device 202b is in a low resistive state (e.g., storing a logical '0') the current $I_R$ will be greater than if the second MRAM device 202b is in a high resistive state (e.g., storing a logical '1').

A multiplexor 802 may be used to determine a desired output of the memory array 102. The multiplexor 802 is configured to selectively provide the current $I_R$ from the second MRAM device 202b to a sense amplifier 804 that is configured to compare the current $I_R$ to a reference current $I_{REF}$ to determine a data state stored in the second MRAM device 202b.

Figure 9A:
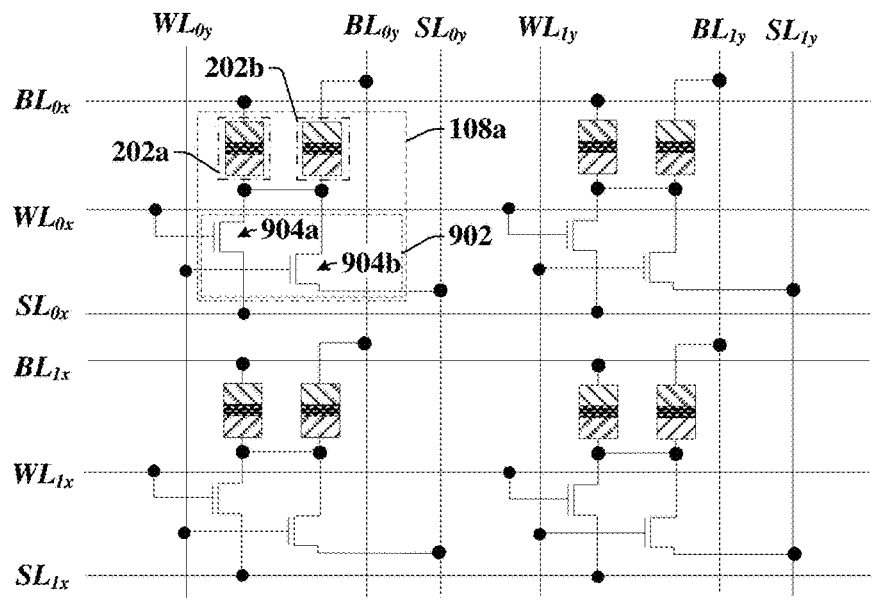
FIGS. 9A-9B illustrate some alternative embodiments of an integrated chip having a shared control element configured to separately provide access to multiple MRAM devices.
Figure 9B:
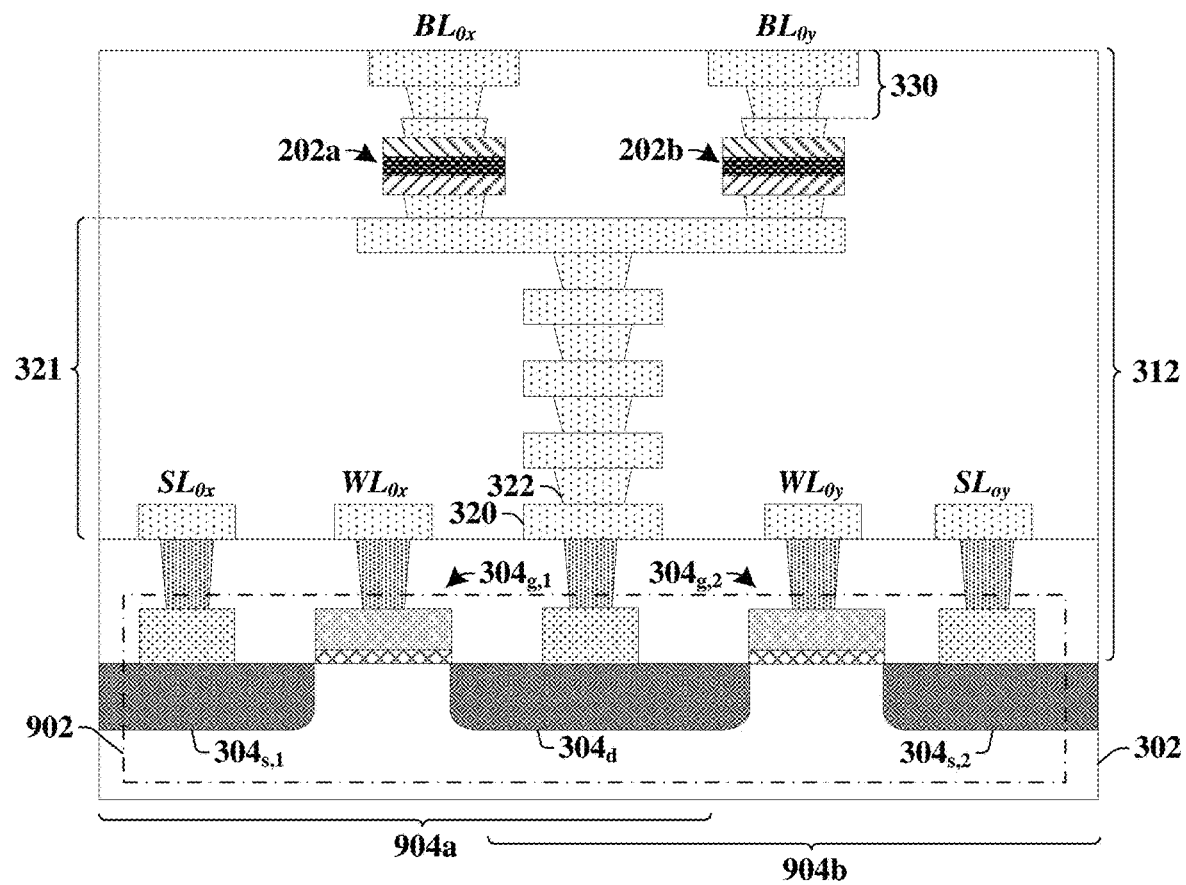

FIGS. 9A-9B illustrate some alternative embodiments of an integrated chip having a shared control element configured to separately provide access to multiple MRAM devices.

As shown in schematic diagram 900 of FIG. 9A, the integrated chip comprises a plurality of shared control elements 902 respectively configured to provide access to a first MRAM device 202a and a second MRAM device 202b. The shared control elements 902 comprise two separate control devices sharing one or more components. For example, the shared control elements 902 respectively include separate control devices comprising a first driving transistor 904a and a second driving transistor 904b having sharing a drain region.

In some embodiments, shown in the cross-sectional view 906 of FIG. 9B, the first driving transistor 904a comprises a first gate structure $304_{g,1}$ disposed over a substrate 302 between a first source region $304_{s,1}$ and a drain region 304d. The first gate structure $304_{g,1}$ is coupled to a first word-line $WL_{0x}$ and the first source region $304_{s,1}$ is coupled to a first source-line $SL_{0x}$. The second driving transistor 904b comprises a second gate structure $304_{g,2}$ disposed over the substrate 302 between a second source region $304_{s,2}$ and the drain region 304d. The second gate structure $304_{g,2}$ is coupled to a second word-line $WL_{0y}$ and the second source region $304_{s,2}$ is coupled to a second source-line $SL_{0y}$. The drain region 304d is coupled to a first MRAM device 202a and a second MRAM device 202b by way of a plurality of interconnect layers 321, comprising interconnect wires 320 and vias 322 surrounded by a dielectric structure 312. The first MRAM device 202a is further coupled to a first bit-line $BL_{0x}$ by way of one or more additional interconnect layers 330 over the first MRAM device 202a. The second MRAM device 202b is further coupled to a second bit-line $BL_{0y}$ by way of one or more additional interconnect layers 330 over the second MRAM device 202b.

During operation, the first MRAM device 202a can be accessed by activating the first word-line $WL_{0x}$ and biasing the first bit-line $BL_{0x}$ and/or the first source-line $SL_{0x}$. The second MRAM device 202b can be accessed by activating the second word-line $WL_{0y}$ and biasing the second bit-line $BL_{0y}$ and/or the second source-line $SL_{0y}$. In some embodiments, the first source-line $SL_{0x}$ and the second source-line $SL_{0y}$ may comprise a common source-line (i.e., be electrically coupled together). By sharing a drain region 304d between the first driving transistor 904a and the second driving transistor 904b, an area of the substrate 302 consumed by both first driving transistor 904a and the second driving transistor 904b is reduced over that of driving transistors having separate components, thereby allowing for a size of a memory array to be reduced.

Figure 10:
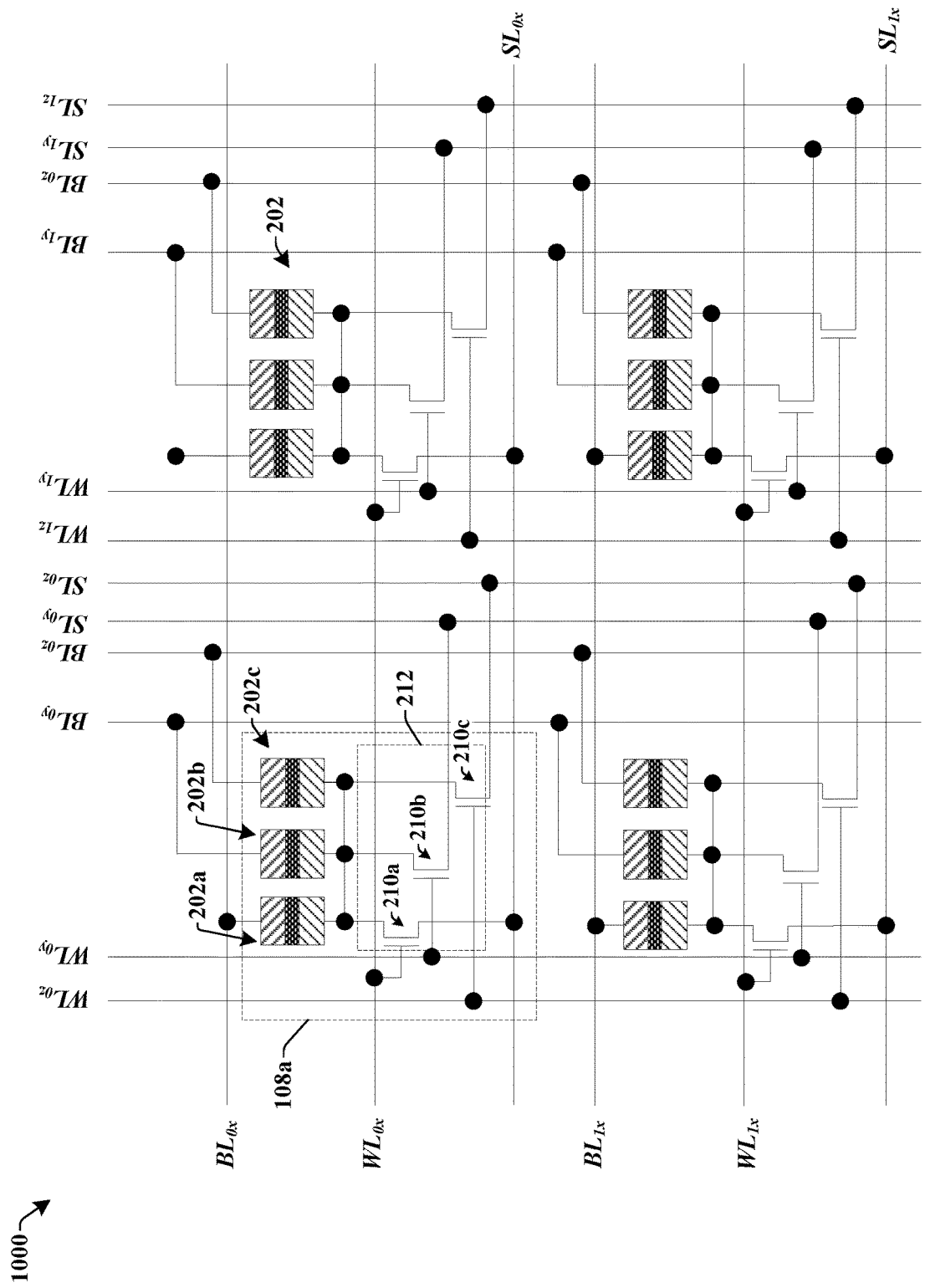
FIG. 10 illustrates a schematic diagram of some additional embodiments of a memory circuit having a shared control element configured to separately provide access to three MRAM devices.

It will be appreciated that in some embodiments, a shared control element comprising shared control transistors that share a drain region (e.g., as shown in FIGS. 9A-9B) may be coupled to a larger number of memory devices (e.g., three, four, or more memory devices may be coupled to a shared control element). For example, FIG. 10 illustrates a schematic diagram of some embodiments of a memory array 1000 having three memory devices coupled to a shared control element 212 comprising shared driving transistors 210a-210c sharing a drain region.

The memory array 1000 comprises a plurality of MRAM devices 202 arranged in rows and columns. Within a first memory region 108a, three MRAM devices 202a-202c of the plurality of MRAM devices 202 are coupled to a shared control element 212 comprising three shared driving transistors 210a-210c. The three shared driving transistors 210a-210c are respectively configured to selectively provide access to the three of the MRAM devices 202a-202c. For example, a first shared driving transistor 210a is configured to selectively provide access to a first MRAM device 202a, a second shared driving transistor 210b is configured to selectively provide access to a second MRAM device 202b, and a third shared driving transistor 210c is configured to selectively provide access to a third MRAM device 202c.

The three shared driving transistors 210a-210c have source terminals coupled to different source-lines $SL_{0x}$-$SL_{0z}$, gate terminals coupled to different word-lines $WL_{0x}$-$WL_{0z}$, and a shared drain terminal coupled to the three MRAM devices 202a-202c, which are respectively coupled to separate bit-lines $BL_{0x}$, $BL_{0z}$, and $BL_{0y}$. For example, the three shared driving transistors 210a-210c may comprise a first driving transistor 210a, a second driving transistor 210b, and a third driving transistor 210c. The first driving transistor 210a has a first source terminal coupled to a first source-line $SL_{0x}$, a first gate terminal coupled to a first word-line $WL_{0x}$, and a first drain terminal coupled to a first MRAM device 202a that is coupled to a first bit-line $BL_{0x}$. The second driving transistor 210b has a second source terminal coupled to a second source-line $SL_{0y}$, a second gate terminal coupled to a second word-line $WL_{0y}$, and a second drain terminal coupled to the first drain terminal (e.g., shared with the first drain terminal) and to a second MRAM device 202b that is coupled to a second bit-line $BL_{0y}$. The third driving transistor 210c has a third source terminal coupled to a third source-line $SL_{0z}$, a third gate terminal coupled to a third word-line $WL_{0z}$, and a third drain terminal coupled to the first drain terminal (e.g., shared with the first drain terminal) and to a third MRAM device 202c that is coupled to a third bit-line $BL_{0z}$. It will be appreciated that by coupling the three shared driving transistors 210a-210c to separate source-lines $SL_{0x}$-$SL_{0z}$, a single word-line may be activated to access a MRAM device 202.

Figure 11A:
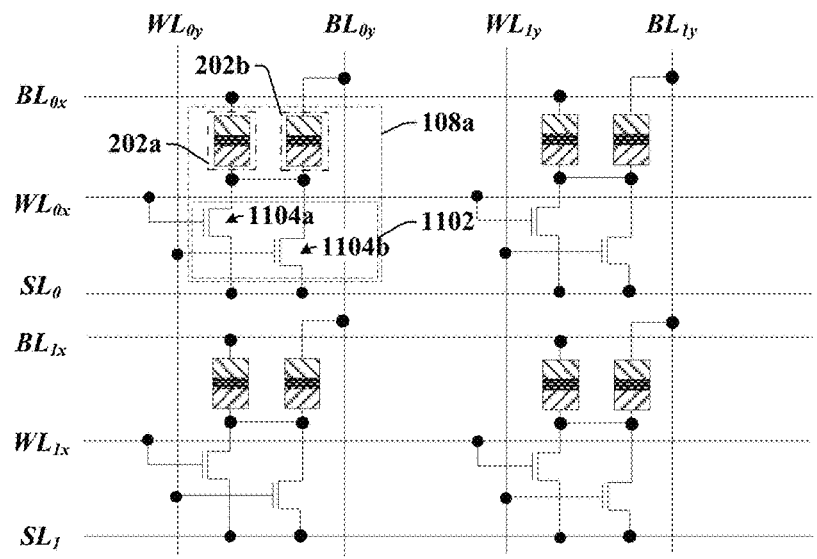
FIGS. 11A-11C illustrate some alternative embodiments of an integrated chip having a shared control element configured to separately provide access to multiple MRAM devices.
Figure 11B:
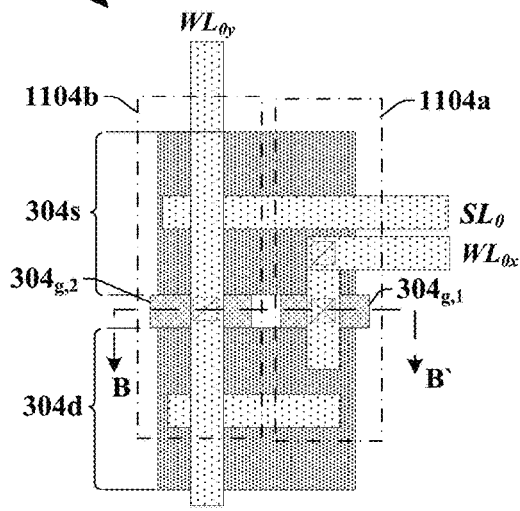
Figure 11C:
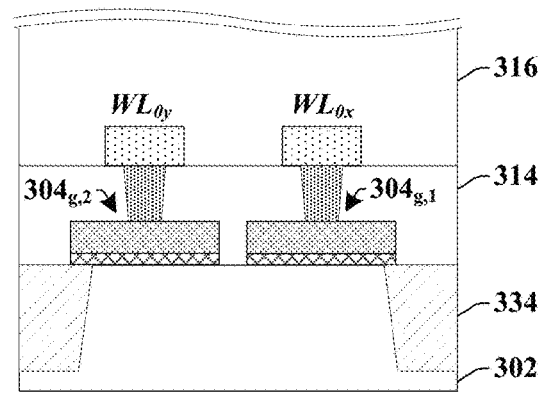

FIGS. 11A-11C illustrate some alternative embodiments of an integrated chip having a shared control element configured to separately provide access to multiple MRAM devices.

As shown in schematic diagram 1100 of FIG. 11A, the integrated chip comprises a plurality of shared control elements 1102 respectively configured to provide access to a first MRAM device 202a and a second MRAM device 202b. The shared control elements 1102 comprise two separate control devices sharing one or more components. For example, the shared control elements 1102 respectively include separate control devices comprising a first driving transistor 1104a and a second driving transistor 1104b sharing a source region and a drain region.

In some embodiments, shown in the top-view 1106 of FIG. 11B, the first driving transistor 1104a comprises a first gate structure $304_{g,1}$ disposed between a source region 304s and a drain region 304d. The first gate structure $304_{g,1}$ is coupled to a first word-line $WL_{0x}$. The second driving transistor 1104b comprises a second gate structure $304_{g,2}$ disposed between the source region 304s and the drain region 304d. The second gate structure $304_{g,2}$ is coupled to a second word-line $WL_{0y}$. The source region 304a is coupled to a source-line $SL_0$ and the drain region 340d is coupled to a first MRAM device and a second MRAM device (not shown). FIG. 11C illustrates a cross-sectional view 1108, showing the first gate structure $304_{g,1}$ coupled to the first word-line $WL_{0x}$ and the second gate structure $304_{g,2}$ coupled to the second word-line $WL_{0y}$ along cross-sectional view B-B' of FIG. 11B.

During operation, the first MRAM device 202a can be accessed by activating the first word-line $WL_{0x}$ and biasing the first bit-line $BL_{0x}$ and/or the source-line $SL_0$. The second MRAM device 202b can also be accessed by activating the second word-line $WL_{0y}$ and biasing the second bit-line $BL_{0y}$ and/or the source-line $SL_0$. In some embodiments, the source-line $SL_0$ may comprise a common source-line (i.e., be electrically coupled to source-line $SL_1$). By sharing a source region 304s and a drain region 304d between the first driving transistor 1104a and the second driving transistor 1104b, an area of the substrate 302 consumed by both first driving transistor 1104a and the second driving transistor 1104b is reduced over that of driving transistors having separate components, thereby allowing for a size of a memory array to be reduced.

Figure 12:
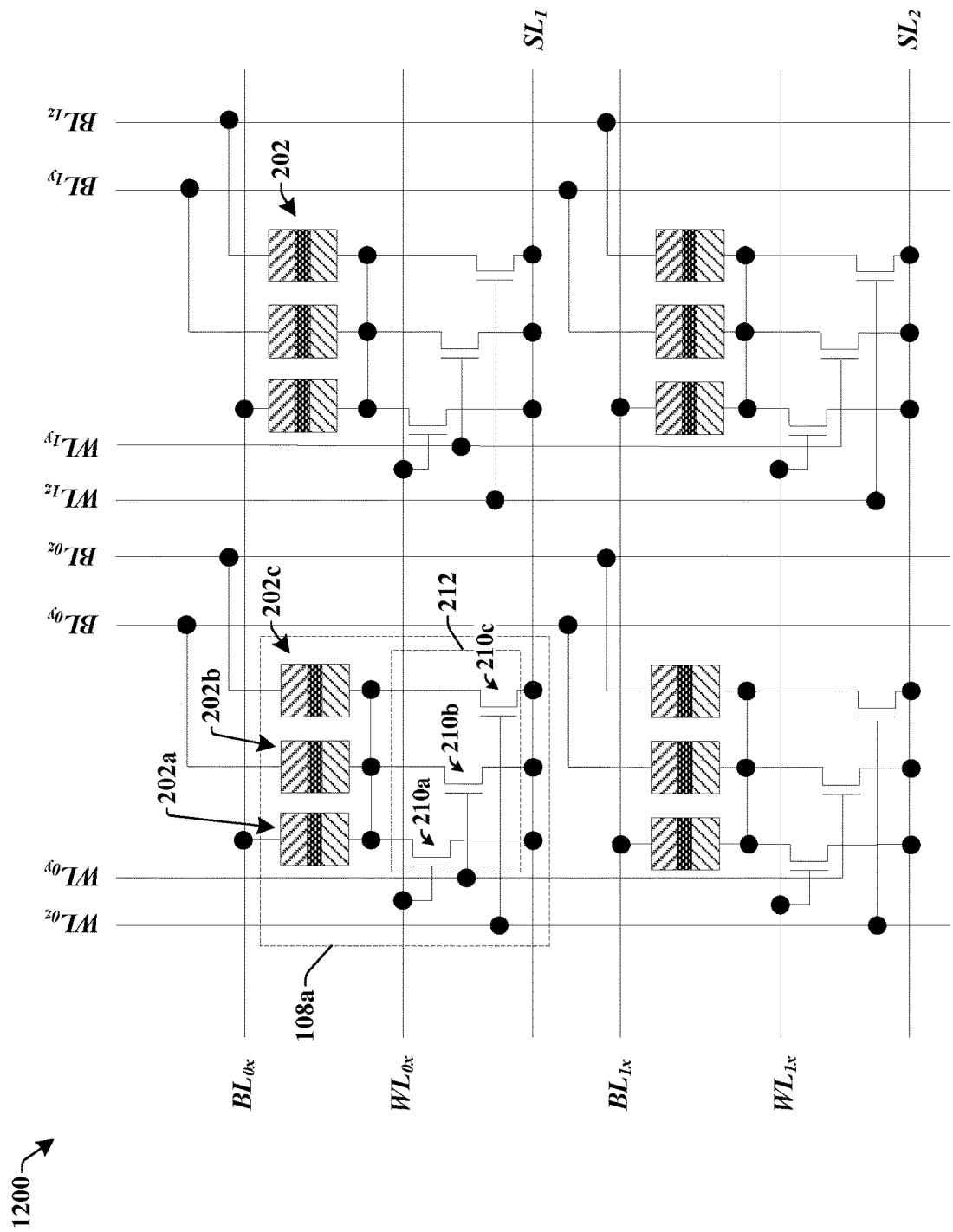
FIG. 12 illustrates a schematic diagram of some additional embodiments of a memory circuit having a shared control element configured to separately provide access to three MRAM devices.

It will be appreciated that in some embodiments, a shared control element comprising shared control transistors that share a source region and a drain region (e.g., as shown in FIGS. 11A-11C) may be coupled to a larger number of memory devices (e.g., three, four, or more memory devices may be coupled to a shared control element). For example, in some embodiments, shown in FIG. 12, a memory array 1200 may comprise three memory devices coupled to a shared control element 212 comprising shared driving transistors 210a-210c sharing a source region and a drain region.

The memory array 1200 comprises a plurality of MRAM devices 202 arranged in rows and columns. Within a first memory region 108a, three MRAM devices 202a-202c of the plurality of MRAM devices 202 are coupled to a shared control element 212 comprising three shared driving transistors 210a-210c. The three shared driving transistors 210a-210c are respectively configured to selectively provide access to the three of the MRAM devices 202a-202c. For example, a first shared driving transistor 210a is configured to selectively provide access to a first MRAM device 202a, a second shared driving transistor 210b is configured to selectively provide access to a second MRAM device 202b, and a third shared driving transistor 210c is configured to selectively provide access to a third MRAM device 202c.

The three shared driving transistors 210a-210c respectively have a shared source terminal coupled to a source-line $SL_1$, a gate terminal coupled to different word-lines $WL_{0x}$-$WL_{0z}$, and a shared drain terminal coupled to the three MRAM devices 202a-202c, which are respectively coupled to separate bit-lines $BL_{0x}$, $BL_{0z}$, and $BL_{0y}$. For example, the three shared driving transistors 210a-210c may comprise a first driving transistor 210a, a second driving transistor 210b, and a third driving transistor 210c. The first driving transistor 210a has a first source terminal coupled to a first source-line $SL_1$, a first gate terminal coupled to a first word-line $WL_{0x}$, and a first drain terminal coupled to a first MRAM device 202a that is coupled to a first bit-line $BL_{0x}$. The second driving transistor 210b has a second source terminal coupled to the first source terminal (e.g., shared with the first source terminal) and to the first source-line $SL_1$, a second gate terminal coupled to a second word-line $WL_{0y}$, and a second drain terminal coupled to the first drain terminal (e.g., shared with the first drain terminal) and to a second MRAM device 202b. The third driving transistor 210c has a third source terminal coupled to the first source terminal and to the first source-line $SL_1$, a third gate terminal coupled to a third word-line $WL_{0z}$, and a third drain terminal coupled to the first drain terminal and to a third MRAM device 202c. In some embodiments, the three shared driving transistors 210a-210c may be concurrently activated to access one of the three MRAM devices 202a-202c.

FIGS. 13-17 illustrate cross-sectional views 1300-1700 of some embodiments of a method of forming an integrated chip comprising a memory circuit having a shared control element configured to separately provide access to multiple MRAM devices. Although FIGS. 13-17 are described in relation to a method, it will be appreciated that the structures disclosed in FIGS. 13-17 are not limited to such a method, but instead may stand alone as structures independent of the method.

Figure 13:
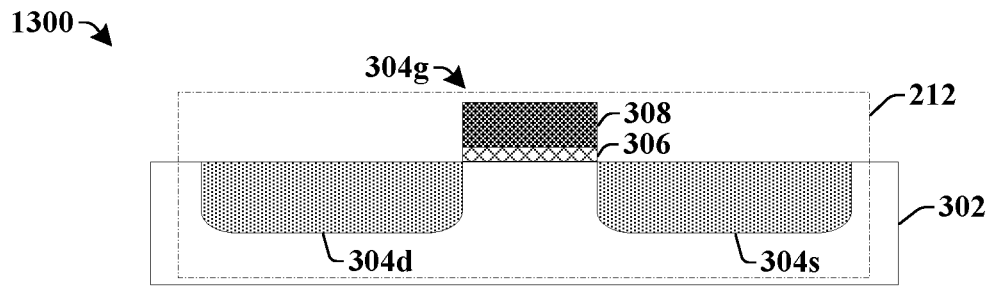

As shown in cross-sectional view 1300 of FIG. 13, a shared control element 212 is formed within a substrate 302. In various embodiments, the substrate 302 may be any type of semiconductor body (e.g., silicon, SiGe, SOI, or the like), such as a semiconductor wafer and/or one or more die on a wafer, as well as any other type of semiconductor and/or epitaxial layers, associated therewith. In some embodiments, the shared control element 212 may comprise a MOSFET. In such embodiments, the shared control element 212 may be formed by depositing a gate dielectric film and a gate electrode film over the substrate 302. The gate dielectric film and the gate electrode film are subsequently patterned to form a gate structure 304g having a gate dielectric 306 and a gate electrode 308. The substrate 302 may be subsequently implanted to form a source region 304s and a drain region 304d within the substrate 302 on opposing sides of the gate structure 304g. In alternative embodiments, the shared control element 212 may comprise a bi-polar junction transistor (BJT), a high electron mobility transistor (HEMT), or a similar device.

Figure 14:
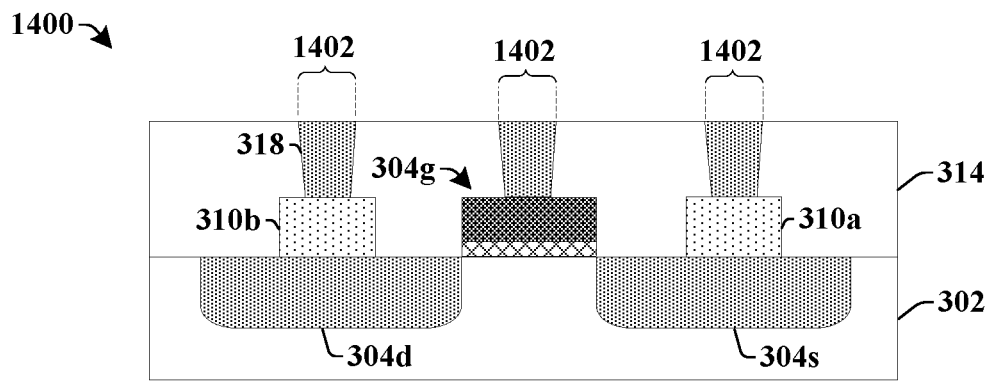

As shown in cross-sectional view 1400 of FIG. 14, middle-end-of-the-line (MEOL) structures 310a-310b are respectively formed over the source region 304s and the drain region 304d. The MEOL structures 310a-310b are vertically disposed between the substrate 302 and a horizontal plane extending along a top of the gate structure 304g. In some embodiments, the MEOL structures 310a-310b may directly contact the source region 304s and the drain region 304d. In some embodiments, the MEOL structures 310a-310b may be formed by depositing a conductive material over the substrate 302 and subsequently patterning the conductive material to define the MEOL structures 310a-310b. In other embodiments (not shown), the MEOL structures 310a-310b may be formed by way of a damascene process (e.g., that forms the MEOL structures 310a-310b by selectively etching pre-metal dielectric layer 314 to form openings, depositing a conductive material within the openings, and performing a CMP process to define the MEOL structures 310a-310b).

A pre-metal dielectric layer 314 is formed over the substrate 302 surrounding the MEOL structures 310a-310b. In some embodiments, the pre-metal dielectric layer 314 may be formed by way of a deposition technique. In various embodiments, the pre-metal dielectric layer 314 may comprise silicon oxynitride, silicon oxide, borosilicate glass (BSG), phosphoric silicate glass (PSG), borophosphosilicate glass (BPSG), fluorinated silicate glass (FSG), low-k material, porous dielectric material, or the like.

After being formed over the substrate 302, the pre-metal dielectric layer 314 is patterned to define contact openings 1402 over the MEOL structures 310a-310b and the gate structure 304g. In some embodiments, the pre-metal dielectric layer 314 may be patterned by forming a patterned masking layer (e.g., a photoresist layer) over the pre-metal dielectric layer 314 and performing an etching process to remove parts of the pre-metal dielectric layer 314 not covered by the patterned masking layer. The contact openings 1402 are filled with a conductive material to form conductive contacts 318 extending from the MEOL structures 310a-310b and the gate structure 304g to an upper surface of the pre-metal dielectric layer 314. In some embodiments, the conductive material may comprise a metal (e.g., tungsten, aluminum, or the like) formed by way of a deposition process (e.g., CVD, PVD, PE-CVD, ALD, or the like) and/or a plating process (e.g., an electro-plating process, an electro-less plating process, or the like).

Figure 15A:
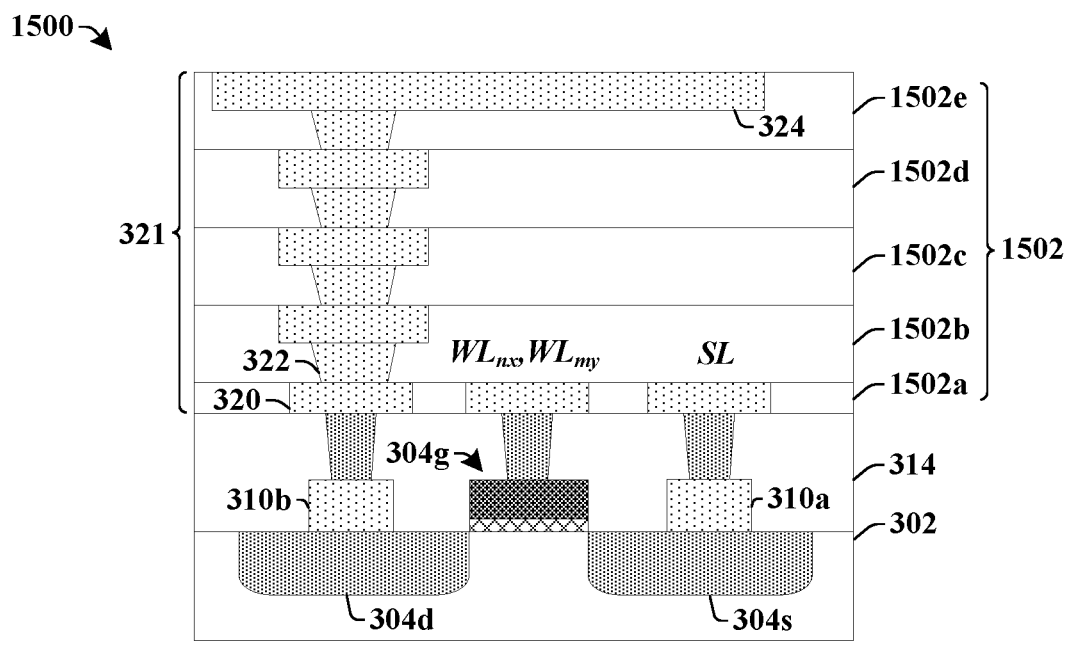

As shown in cross-sectional view 1500 of FIG. 15A, a plurality of interconnect layers 321 are formed within a first ILD structure 1502 over the pre-metal dielectric layer 314. In some embodiments, the first ILD structure 1502 comprises a plurality of stacked inter-level dielectric (ILD) layers 1502a-1502e, and the plurality of interconnect layers 321 comprise alternating layers of interconnect wires 320 and vias 322. In some embodiments, the plurality of stacked ILD layers 1502a-1502e may respectively comprise a dielectric (e.g., an oxide, a low-k dielectric, an ultra low-k dielectric, or the like). In some embodiments, the interconnect wires 320 and vias 322 may comprise a metal (e.g., copper, aluminum, or the like).

The plurality of interconnect layers 321 couple the source region 304s to a source-line SL and the gate structure 304g to a first word-line $WL_{nx}$ (n=1,2,3, . . . ) and a second word-line $WL_{my}$ (m=1,2,3, . . . ). The plurality of interconnect layers 321 may be formed by separately depositing the plurality of stacked ILD layers 1502a-1502e over the pre-metal dielectric layer 314, selectively etching the plurality of stacked ILD layers 1502a-1502e to define a via hole and/or a trench within the ILD layer, forming a conductive material within the via hole and/or a trench to fill the opening, and performing a planarization process (e.g., a chemical mechanical planarization process).

Figure 15B:
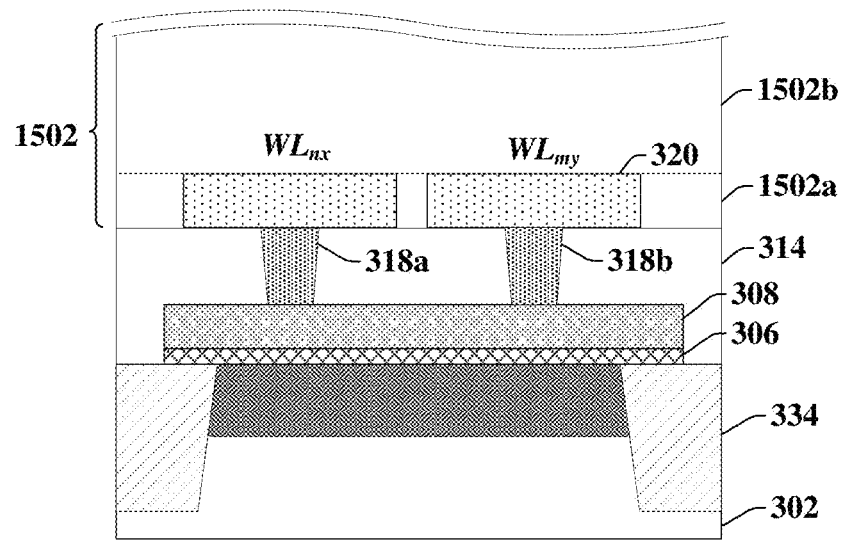

As shown in cross-sectional view 1504 of FIG. 15B (shown along a cross-section going into the page of FIG. 15A), interconnect wires 320 are coupled to the gate electrode 308 by way of a first conductive contact 318a and a second conductive contact 318b that is laterally separated from the first conductive contact 318a by the pre-metal dielectric layer 314. The first conductive contact 318a couples the gate electrode 308 to the first word-line $WL_{nx}$ and the second conductive contact 318b couples the gate electrode 308 to the second word-line $WL_{my}$. Although the first word-line $WL_{nx}$ and the second word-line $WL_{my}$ are shown in cross-sectional view 1504 as being on a first interconnect wire layer, it will be appreciated that in other embodiments, the first word-line $WL_{nx}$ and the second word-line $WL_{my}$ can be on higher interconnect wire layers (e.g., on a second interconnect wire layer, a third interconnect wire layer, etc.).

Figure 16:
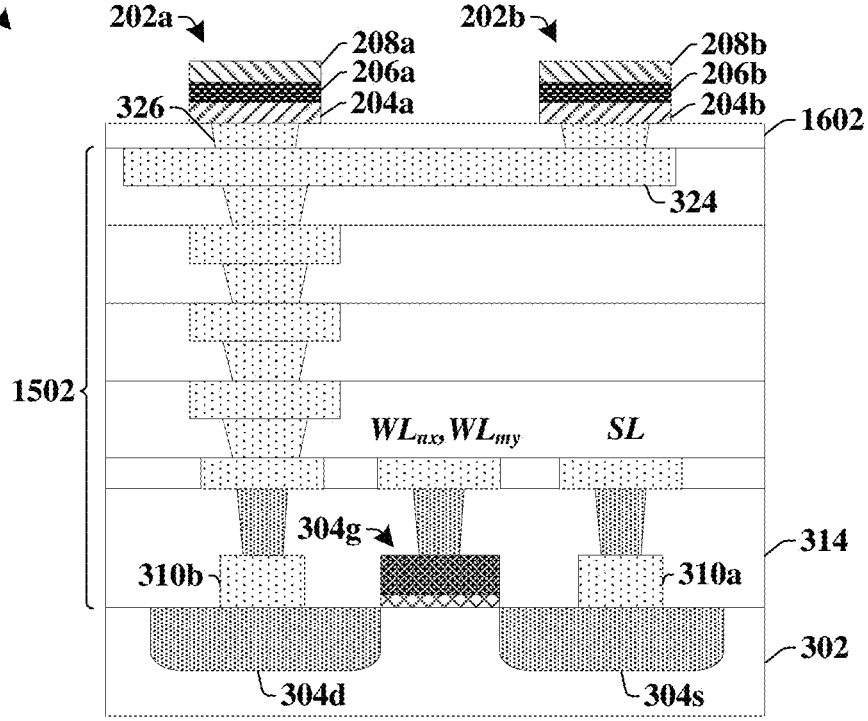

As shown in cross-sectional view 1600 of FIG. 16, a first MRAM device 202a and a second MRAM device 202b are formed over an interconnect wire 324 within the first ILD structure 1502. The first MRAM device 202a comprises a first MTJ having a first pinned layer 204a separated from a first free layer 208a by a first dielectric tunnel barrier 206a. The second MRAM device 202b comprises a second MTJ having a second pinned layer 204b separated from a second free layer 208b by a second dielectric tunnel barrier 206b. In some embodiments, the first pinned layer 204a and the second pinned layer 204b may be formed onto bottom electrode vias 326 that contact the interconnect wire 324. The bottom electrode vias 326 are surrounded by a dielectric layer 1402.

In some embodiments, the first MRAM device 202a and the second MRAM device 202b may be concurrently formed. In other embodiments, the first MRAM device 202a may be formed at a different time than the second MRAM device 202b. In some embodiments, the first MRAM device 202a and the second MRAM device 202b may be formed by depositing a magnetic pinned film over the first ILD structure 1502, forming a dielectric barrier film over the magnetic pinned film, and forming a magnetic free film over the dielectric barrier film. One or more patterning processes are performed on the magnetic pinned film, the dielectric barrier layer, and the magnetic free film to define the first MRAM device 202a and the second MRAM device 202b. In some embodiments, the one or more patterning processes may use a dry etchant having an etching chemistry comprising a fluorine species (e.g., $CF_4$, $CHF_3$, $C_4F_8$, etc.) or a wet etchant (e.g., HF, KOH, or the like).

As shown in cross-sectional view 1700 of FIG. 17, a second ILD structure 1702 is formed over the first MRAM device 202a and the second MRAM device 202b. The second ILD structure 1702 may be formed by one or more deposition processes (e.g., PVD, CVD, PE-CVD, etc.). One or more additional interconnect layers 330 are formed within the second ILD structure 1702. The one or more additional interconnect layers 330 couple the first MRAM device 202a to a first bit-line $BL_{nx}$ and the second MRAM device 202b to a second bit-line $BL_{my}$. In some embodiments, the one or more additional interconnect layers 330 may be formed by selectively etching the second ILD structure 1702 to form openings within the second ILD structure 1702. A conductive material (e.g., copper and/or aluminum) is then deposited within the openings.

FIG. 18 illustrates a flow diagram of some embodiments of a method 1800 of forming integrated chip comprising a memory circuit having a shared driving transistor configured to separate provide access to multiple memory devices.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a shared control element is formed within a substrate. The shared control element has one or more gate structure arranged between a drain region and one or more source regions within the substrate. In some embodiments, the shared control element may comprise a driving transistor having a gate structure arranged between a source region and a drain region within the substrate. In other embodiments, the shared control element may comprise multiple driving transistors sharing one or more components (e.g., a source region, a drain region, etc.). FIG. 13 illustrates a cross-sectional view 1300 of some embodiments corresponding to act 1802.

At 1804, a plurality of interconnect layers are formed within a first ILD structure over the substrate. The plurality of interconnect layers couple a source region to a source-line and the one or more gate structures to a first word-line and a second word-line. FIGS. 14-15B illustrate cross-sectional views 1400-1504 of some embodiments corresponding to act 1804.

At 1806, a first MRAM device is formed to be coupled to the drain region. In some embodiments, the first MRAM device is formed to have a first pinned layer coupled to the drain region. The first pinned layer is separated from a first free layer by a first dielectric barrier layer. FIG. 16 illustrates a cross-sectional view 1600 of some embodiments corresponding to act 1806.

At 1808, a second MRAM device is formed to be coupled to the drain region. In some embodiments, the second MRAM device is formed to have a second pinned layer coupled to the drain region. The second pinned layer is separated from a second free layer by a second dielectric barrier layer. FIG. 16 illustrates a cross-sectional view 1600 of some embodiments corresponding to act 1808.

At 1810, one or more additional interconnect layers are formed to couple the first MRAM device to a first bit-line and the further couple the second MRAM device to a second bit-line. In some embodiments, the additional interconnect layers are formed to couple the first free layer of first MRAM device to a first bit-line and to couple the second free layer of the second MRAM device to a second bit-line. FIG. 17 illustrates a cross-sectional view 1700 of some embodiments corresponding to act 1810.

Accordingly, in some embodiments, the present disclosure relates to an integrated chip comprising a memory array having a shared control element that is shared between multiple memory devices (e.g., MRAM devices).

In some embodiments, the present disclosure relates to an integrated chip. The integrated chip includes a first memory device arranged over a substrate and coupled to a first bit-line; a second memory device arranged over the substrate and coupled to a second bit-line; and a shared control element arranged within the substrate and configured to provide access to the first memory device and to separately provide access to the second memory device, the shared control element includes one or more control devices sharing one or more components. In some embodiments, the shared control element includes a driving transistor having a source region coupled to a source-line, a drain region coupled to the first memory device and the second memory device, and a gate structure coupled to a first word-line and a second word-line. In some embodiments, the gate structure includes a gate electrode separated from the substrate by a gate dielectric; the first word-line is coupled to the gate electrode by a first conductive contact disposed on the gate electrode and the second word-line is coupled to the gate electrode by a second conductive contact disposed on the gate electrode. In some embodiments, the integrated chip further includes a third word-line coupled to the gate structure and a third memory device coupled between the gate structure and a third bit-line. In some embodiments, the first memory device includes a first magneto-resistive random-access memory (MRAM) device and the second memory device includes a second MRAM device. In some embodiments, the shared control element includes a first driving transistor having a first gate structure coupled to a first word-line and arranged over the substrate between a first source region coupled to a first source-line and a drain region coupled to the first memory device and the second memory device; and a second driving transistor having a second gate structure coupled to a second word-line and arranged over the substrate between a second source region coupled to a second source-line and the drain region. In some embodiments, the shared control element is coupled to a first word-line and to a second word-line. In some embodiments, the integrated chip further includes a word-line decoder configured to apply a first non-zero voltage to the first word-line; and a bit-line decoder configured to concurrently apply a second non-zero voltage to the first bit-line and a third non-zero voltage to the second bit-line. In some embodiments, the first memory device and the second memory device are disposed within a memory array having a plurality of memory devices arranged in rows and columns; and the first bit-line is coupled to a first plurality memory devices within one of the columns and the second bit-line is coupled to a second plurality of memory devices within one of the rows. In some embodiments, the first bit-line and the second bit-line extend in different directions.

In other embodiments, the present disclosure relates to an integrated chip. The integrated chip includes a memory array having a plurality of magneto-resistive random-access memory (MRAM) devices arranged in rows and columns, the plurality of MRAM devices include a first MRAM device coupled to a first bit-line that is further coupled to a first plurality of the MRAM devices within one of the rows of the memory array a second MRAM device coupled to a second bit-line that is further coupled to a second plurality of the MRAM devices within one of the columns of the memory array; and a driving transistor having a gate structure coupled to a word-line and arranged between a source region and a drain region that is coupled to the first MRAM device and the second MRAM device. In some embodiments, the gate structure is further coupled to a second word-line. In some embodiments, the word-line includes an unbroken interconnect wire that continuously extends over a plurality of gate structures along a first direction; and the second word-line includes a plurality of discrete interconnect wires respectively extending over one of the plurality of gate structures and separated along a second direction by a non-zero space. In some embodiments, the integrated chip further includes a second driving transistor having a second gate structure coupled to a second word-line and arranged between a second source region and the drain region. In some embodiments, the integrated chip further includes a second driving transistor having a second gate structure coupled to a second word-line and arranged between the source region and the drain region. In some embodiments, the first MRAM device includes a first pinned layer and a first free layer that is electrically between the first pinned layer and the driving transistor; and the second MRAM device includes a second pinned layer and a second free layer that is electrically between the second pinned layer and the driving transistor. In some embodiments, the first pinned layer and the second pinned layer are arranged along an upper surface of an interconnect wire that continuously extends below the MRAM device and the second MRAM device. In some embodiments, the first MRAM device includes a first free layer and a first pinned layer that is electrically between the first free layer and the driving transistor; and the second MRAM device includes a second free layer and a second pinned layer that is electrically between the second free layer and the driving transistor.

In yet other embodiments, the present disclosure relates to a method of forming an integrated chip. The method includes forming a shared control element having one or more gate structures arranged between a drain region and one or more source regions within a substrate; forming one or more interconnect layers within an inter-level dielectric (ILD) structure over the substrate, wherein the one or more interconnect layers defining a first word-line and a second word-line coupled to the one or more gate structures; forming a first memory device and a second memory device within the ILD structure, wherein the first memory device and the second memory device are coupled to the drain region; and forming one or more additional interconnect layers defining a first bit-line coupled to the first memory device and a second bit-line coupled to the second memory device. In some embodiments, the first bit-line is coupled to a first plurality of memory devices within a column of a memory array and the second bit-line is coupled to a second plurality of memory devices within a row of the memory array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first memory device arranged over a substrate and coupled to a first bit-line;
a second memory device arranged over the substrate and coupled to a second bit-line; and
an access transistor arranged within the substrate and comprising a source region coupled to a source-line and a drain region coupled directly to both the first memory device and the second memory device, wherein the access transistor further comprises a gate structure coupled to a first word-line and a second word-line.

2. The integrated circuit of claim 1,
wherein the gate structure comprises a gate electrode separated from the substrate by a gate dielectric; and
wherein the first word-line is coupled to the gate electrode by a first conductive contact disposed on the gate electrode and the second word-line is coupled to the gate electrode by a second conductive contact disposed on the gate electrode.

3. The integrated circuit of claim 1, wherein the first memory device comprises a first magneto-resistive random-access memory (MRAM) device and the second memory device comprises a second MRAM device.

4. The integrated circuit of claim 1, wherein the access transistor is an only transistor connected between the source-line and both the first memory device and the second memory device.

5. The integrated circuit of claim 4, further comprising:
a conductive interconnect wire having a lower surface coupled to the drain region by one or more lower interconnects and having an upper surface that continuously extends from directly below the first memory device to directly below the second memory device.

6. The integrated circuit of claim 1,
wherein the first memory device and the second memory device are disposed within a memory array comprising a plurality of memory devices arranged in rows and columns; and
wherein the first bit-line is coupled to a first plurality memory devices within one of the columns and the second bit-line is coupled to a second plurality of memory devices within one of the rows.

7. The integrated circuit of claim 1, wherein the first bit-line and the second bit-line extend in different directions.

8. The integrated circuit of claim 1, wherein the gate structure comprises an upper surface that continuously extends past a first via coupled to the first word-line and a second via coupled to the second word-line.

9. An integrated circuit, comprising:
a memory array comprising a plurality of magneto-resistive random-access memory (MRAM) devices arranged in rows and columns, wherein the plurality of MRAM devices comprise:
a first MRAM device coupled to a first bit-line that is further coupled to a first plurality of the MRAM devices within one of the rows of the memory array;
a second MRAM device coupled to a second bit-line that is further coupled to a second plurality of the MRAM devices within one of the columns of the memory array; and
a driving transistor having a gate structure coupled to a word-line and arranged between a source region and a drain region that is coupled to the first MRAM device and the second MRAM device.

10. The integrated circuit of claim 9, wherein the gate structure is further coupled to a second word-line.

11. The integrated circuit of claim 10,
wherein the word-line comprises an unbroken interconnect wire that continuously extends over a plurality of gate structures along a first direction; and
wherein the second word-line comprises a plurality of discrete interconnect wires respectively extending over one of the plurality of gate structures and separated along a second direction by a non-zero space.

12. The integrated circuit of claim 9,
wherein the first MRAM device comprises a first pinned layer and a first free layer that is electrically between the first pinned layer and the driving transistor; and
wherein the second MRAM device comprises a second pinned layer and a second free layer that is electrically between the second pinned layer and the driving transistor.

13. The integrated circuit of claim 12, wherein the first pinned layer and the second pinned layer are arranged along an upper surface of an interconnect wire that continuously extends below the first MRAM device and the second MRAM device.

14. The integrated circuit of claim 9,
wherein the first MRAM device comprises a first free layer and a first pinned layer that is electrically between the first free layer and the driving transistor; and
wherein the second MRAM device comprises a second free layer and a second pinned layer that is electrically between the second free layer and the driving transistor.

15. An integrated circuit, comprising:
a first magneto-resistive random access memory (MRAM) device having a first terminal and a second terminal, wherein the second terminal is coupled to a first bit-line;
a second MRAM device having a third terminal and a fourth terminal, wherein the fourth terminal is coupled to a second bit-line; and
a transistor device having a source region coupled to a source-line, a drain region coupled to the first terminal of the first MRAM device and to the third terminal of the second MRAM device, and a gate structure coupled to a first word-line and a second word-line.

16. The integrated circuit of claim 15, further comprising:
a second transistor device having a second source region, a second drain region, and a second gate structure, wherein the second drain region is coupled to a third MRAM device and the second gate structure is coupled to the second word-line and to a third word-line.

17. The integrated circuit of claim 15, wherein the gate structure continuously extends between a first conductive contact coupled to the first word-line and a second conductive contact coupled to the second word-line.

18. The integrated circuit of claim 15,
wherein the first word-line and the second word-line extend along a first direction past opposing sides of the gate structure; and
wherein the first word-line and the second word-line are separated along a second direction that is perpendicular to the first direction.

19. The integrated circuit of claim 15, wherein the gate structure continuously extends from directly below the first word-line to directly below the second word-line.

20. The integrated circuit of claim 15,
wherein the first word-line continuously extends along a first direction from directly over the gate structure to directly over a second gate structure; and
wherein the second word-line has a sidewall that is between the gate structure and the second gate structure, the sidewall facing the second gate structure.

* * * * *